United States Patent
Fang et al.

(10) Patent No.: US 9,368,606 B2
(45) Date of Patent: Jun. 14, 2016

(54) MEMORY FIRST PROCESS FLOW AND DEVICE

(71) Applicant: Spansion LLC, Sunnyvale, CA (US)

(72) Inventors: Shenqing Fang, Fremont, CA (US); Chun Chen, San Jose, CA (US); Unsoon Kim, San Jose, CA (US); Mark Ramsbey, Sunnyvale, CA (US); Kuo Tung Chang, Saratoga, CA (US); Sameer Haddad, San Jose, CA (US); James Pak, Sunnyvale, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 60 days.

(21) Appl. No.: 13/715,577

(22) Filed: Dec. 14, 2012

(65) Prior Publication Data

US 2014/0167140 A1    Jun. 19, 2014

(51) Int. Cl.
H01L 29/792    (2006.01)
H01L 21/336    (2006.01)
H01L 29/66    (2006.01)
(Continued)

(52) U.S. Cl.
CPC .... *H01L 29/66833* (2013.01); *H01L 27/11568* (2013.01); *H01L 27/11573* (2013.01); *H01L 29/42344* (2013.01); *H01L 29/792* (2013.01); *H01L 21/28282* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66

USPC ............ 257/29, 324, 314–316, 365, 311, 303
See application file for complete search history.

(56) References Cited

U.S. PATENT DOCUMENTS 5,824,584 A    10/1998    Chen et al.
5,969,383 A    10/1999    Chang et al.
(Continued)

FOREIGN PATENT DOCUMENTS

JP         2011-40782 A    2/2011
JP         2011040782 A    2/2011
KR    10-2011-0075952 A    7/2011

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.
(Continued)

*Primary Examiner* — Selim Ahmed
*Assistant Examiner* — Moin Rahman

(57) ABSTRACT

Semiconductor devices and methods of manufacturing such devices are described herein. According to embodiments, a semiconductor device includes a memory gate disposed in a first region of the semiconductor device. The memory gate may include a first gate conductor layer disposed over a charge trapping dielectric. A select gate may be disposed in the first region of the semiconductor device adjacent to a sidewall of the memory gate. A sidewall dielectric may be disposed between the sidewall of the memory gate and the select gate. Additionally, the device may include a logic gate disposed in a second region of the semiconductor device that comprises the first gate conductor layer.

24 Claims, 26 Drawing Sheets

(51) Int. Cl.
*H01L 29/423* (2006.01)
*H01L 27/115* (2006.01)
*H01L 21/28* (2006.01)

(56) References Cited

U.S. PATENT DOCUMENTS

| | | | |
|---|---|---|---|
| 6,972,997 | B2 | 12/2005 | Ishimaru et al. |
| 7,057,230 | B2 | 6/2006 | Tanaka et al. |
| 7,115,943 | B2 | 10/2006 | Mine et al. |
| 7,235,441 | B2 | 6/2007 | Yasui et al. |
| 7,371,631 | B2 | 5/2008 | Sakai et al. |
| 7,414,283 | B2 | 8/2008 | Tanaka et al. |
| 7,504,689 | B2 | 3/2009 | Hisamoto et al. |
| 7,557,005 | B2 | 7/2009 | Ishii et al. |
| 7,663,176 | B2 | 2/2010 | Sakai et al. |
| 7,667,259 | B2 | 2/2010 | Yasui et al. |
| 7,700,992 | B2 | 4/2010 | Tanaka et al. |
| 7,723,779 | B2 | 5/2010 | Hisamoto et al. |
| 7,863,135 | B2 | 1/2011 | Sakai et al. |
| 7,863,670 | B2 | 1/2011 | Ishii et al. |
| 8,017,986 | B2 | 9/2011 | Tanaka et al. |
| 8,125,012 | B2 | 2/2012 | Mine et al. |
| 2005/0230736 | A1* | 10/2005 | Ishimaru ............ G11C 16/0466 257/314 |
| 2007/0262382 | A1* | 11/2007 | Ishii et al. ............ 257/350 |
| 2008/0029805 | A1* | 2/2008 | Shimamoto et al. ......... 257/315 |
| 2008/0076221 | A1* | 3/2008 | Kang ............ B82Y 10/00 438/267 |
| 2008/0188052 | A1* | 8/2008 | Winstead et al. ............ 438/299 |
| 2008/0265309 | A1* | 10/2008 | Higashi et al. ............ 257/324 |
| 2009/0273013 | A1 | 11/2009 | Winstead et al. |
| 2010/0029052 | A1 | 2/2010 | Kang et al. |
| 2010/0099246 | A1* | 4/2010 | Herrick et al. ............ 438/591 |
| 2011/0039385 | A1 | 2/2011 | Shimamoto et al. |
| 2011/0175158 | A1* | 7/2011 | Lee et al. ............ 257/324 |
| 2011/0211396 | A1 | 9/2011 | Takeuchi |
| 2013/0221308 | A1* | 8/2013 | Toh et al. ............ 257/2 |

OTHER PUBLICATIONS

Matsubara, K., et al., "Highly Reliable 10ns MONOS Flash," elmicro.com/files/renesas/monos_flash_ewc_2008_for_proceedings.pdf, Renesas Technology Europe GmbH, 2008.
Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.
Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.
Yanagi, I., et al., "Quantum confinement effect of efficient hole injection in MONOS-type nonvolatile memory—the role of ultrathin i-Si/P+ poly-Si stacked gate structure fabricated by laser spike annealing," 146-147, Symposium on VLSI Technology, Digest of Technical Papers, Central Research Laboratory, Hitachi Ltd., 2007.
International Search Report and Written Opinion of the International Searching Authority for International Application No. PCT/US2013/074390, mailed Mar. 26, 2014.
English language abstract of Korean patent publication No. 10-2011-0075952 A.
International Search Report for International Application No. PCT/US2013/074390 dated Mar. 26, 2014; 5 pages.
Written Opinion of the International Searching Authority for International Application No. PCT/US2013/074390 mailed 03826/2014; 5 pages.

* cited by examiner

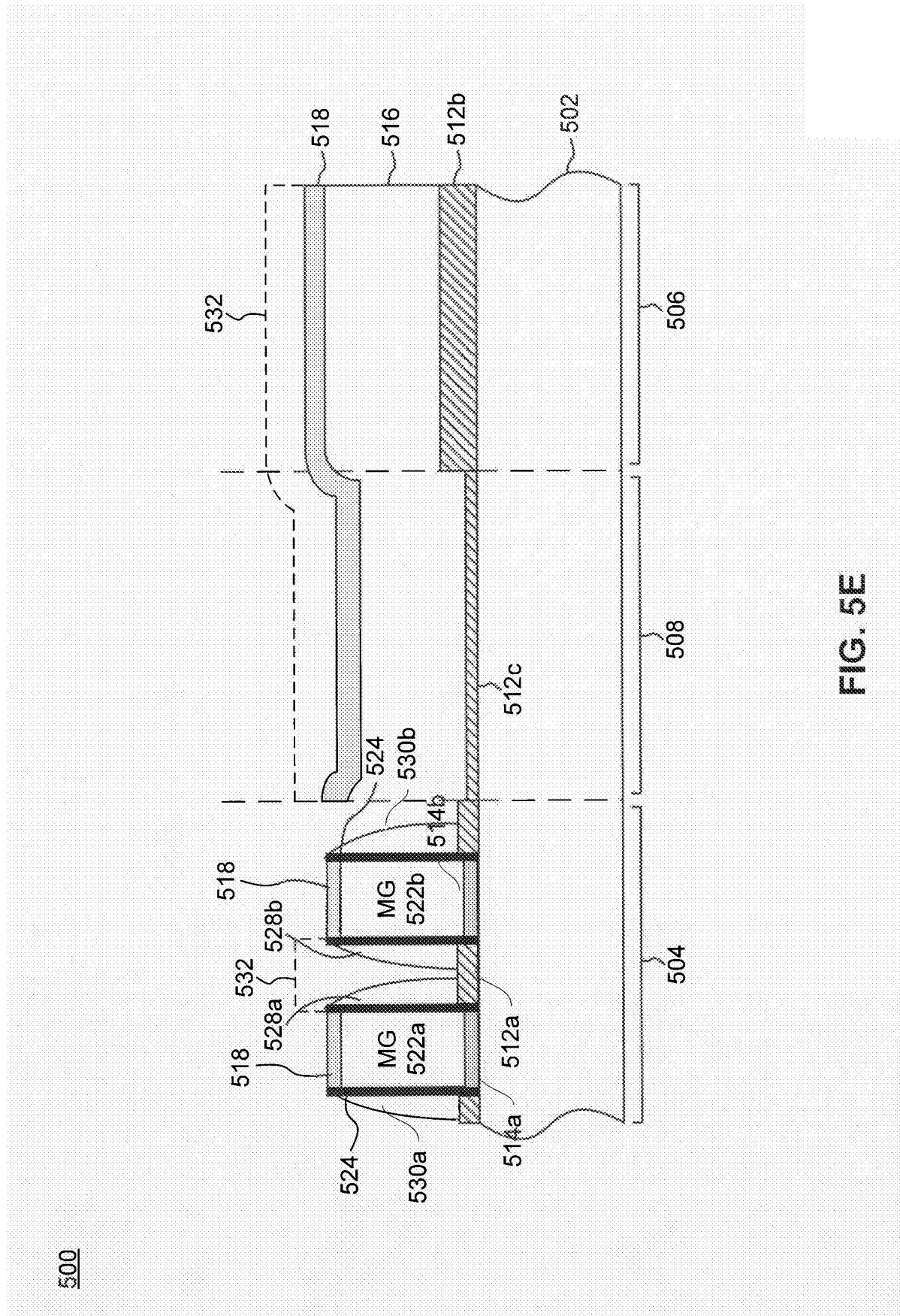

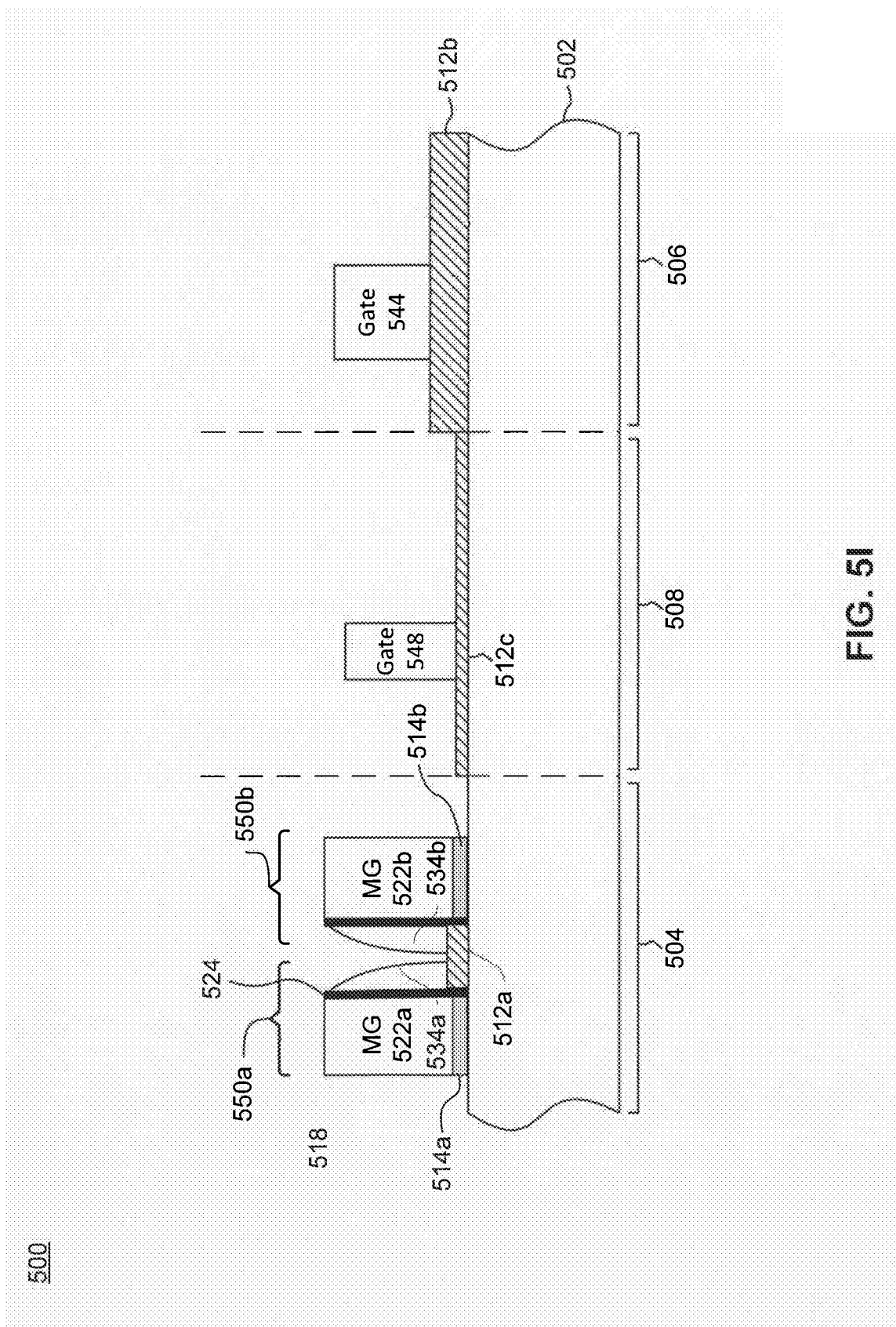

MEMORY FIRST PROCESS FLOW AND DEVICE

BACKGROUND

1. Technical Field

This disclosure relates generally to improved semiconductor device and methods and apparatus for making such semiconductor device.

2. Related Art

A Flash memory permits stored data to be retained even if power to the memory is removed. A Flash memory cell stores data either by storing electrical charge in an electrically isolated floating gate of a field effect transistor (FET) or by storing electrical charge in a dielectric layer underlying a control gate of a FET. The stored electrical charge controls the threshold of the FET, thereby controlling the memory state of the Flash memory cell.

A Flash memory cell is commonly programmed using hot carrier injection to inject charge carriers either onto a floating gate or into charge trapping sites in a dielectric layer underlying a control, gate. High drain and gate voltages are used to speed up the programming process. Thus, the Flash memory cell conducts a high current during programming, which is undesirable in low voltage and low power applications.

A split-gate cell is a type of Flash memory cell, in which a select gate is placed adjacent a memory gate, providing lower current during hot-carrier-based programming operation. During the programming of the split-gate cell, the select gate is biased at a relatively low voltage, and only the memory gate is biased at the high voltage to provide the vertical electric field necessary for hot-carrier injection. Since the acceleration of the carriers takes place in the channel region mostly under the select gate, the relatively low voltage on the select gate above that region results in more efficient carrier acceleration in the horizontal direction compared to the conventional memory cell. That makes the hot-carrier injection more efficient with lower current and lower power consumption during the programming operation. A split-gate cell may be programmed using techniques other than hot-carrier injection, and depending on the technique, any advantage over the conventional Flash memory cell during the programming operation may vary.

Fast read time is another advantage of the split-gate cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erase state at or below zero, the threshold voltage of the programmed state does not need to be very high while still providing a reasonable read margin between the erased and the programmed states. The resulting voltages applied to both the select gate and the memory gate in read operation are less than or equal to the supply voltage. Therefore, not having to pump the supply voltage to a higher level makes the read operation faster.

It is also becoming increasingly common to monolithically incorporate multiple field-effect devices on the same substrate as the memory cells to provide improved efficiency, security, functionality, and reliability. As such, many processes are tailored in order to conform with standard CMOS fabrication. For example, a chip with split-gate cells may also include other field-effect devices to perform various logic and power control processes.

These other field-effect devices may include transistors tailored for high speed operation, while other transistors are tailored for handling higher-than-normal operating voltages. However, incorporating both on the same substrate along with the split-gate cell is challenging as each requires different fabrication parameters. Accordingly, there is a need for device and methods for integrating these split-gate cells and other field-effect devices with improved performance, cost, and manufacturability.

BRIEF SUMMARY OF THE INVENTION

A semiconductor device is provided. According to embodiments, the semiconductor device includes a memory gate disposed in a first region of the semiconductor device. The memory gate may include a first gate conductor layer formed, for instance, of polycrystalline silicon ("poly") disposed over a charge trapping dielectric. A select gate may be disposed in the first region of the semiconductor device adjacent to a sidewall of the memory gate. A sidewall dielectric may be disposed between the sidewall of the memory gate and the select gate. Additionally, the device may include a logic gate disposed in a second region of the semiconductor device that comprises the first gate conductor layer.

A method of manufacturing a semiconductor device having a first region and a second region is provided. According to the method, the second region is masked and a layer of gate conductor is disposed above a charge trapping dielectric in the first region. The gate conductor layer can be etched to form a memory gate. A sidewall dielectric can be disposed on a sidewall of the memory gate and a second layer of gate conductor can be formed. The second layer of gate conductor can then be etched to form a select gate adjacent to the side wall of the memory gate. The first region can then be masked and a logic gate can be formed in the second region of the semiconductor device.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGS.

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIGS. 5A-5I depict a cross-section of a memory device at various points during its manufacture according to various embodiments.

Figure 1:
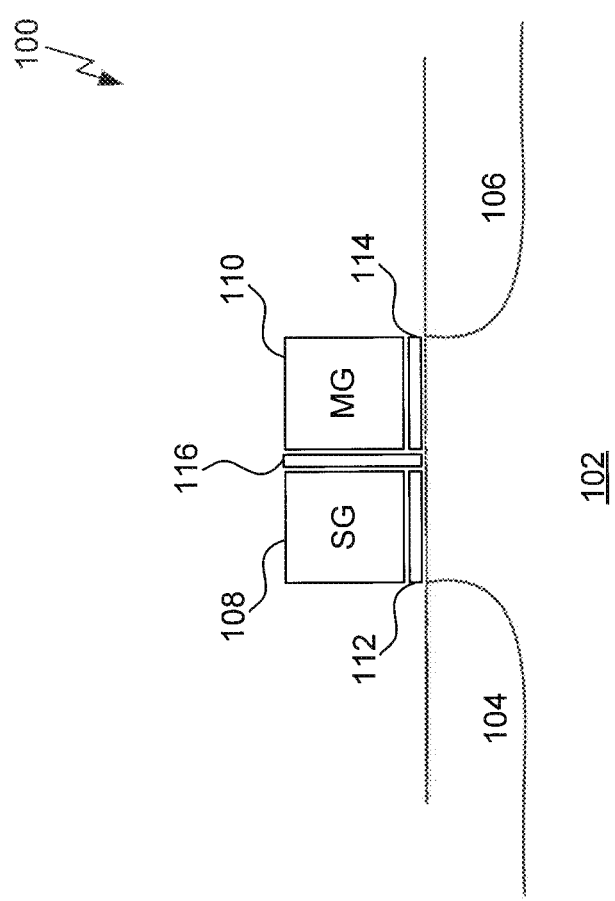
FIG. 1 depicts a cross-section of a split-gate memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain, types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped gate conductor layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. Regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to tarn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
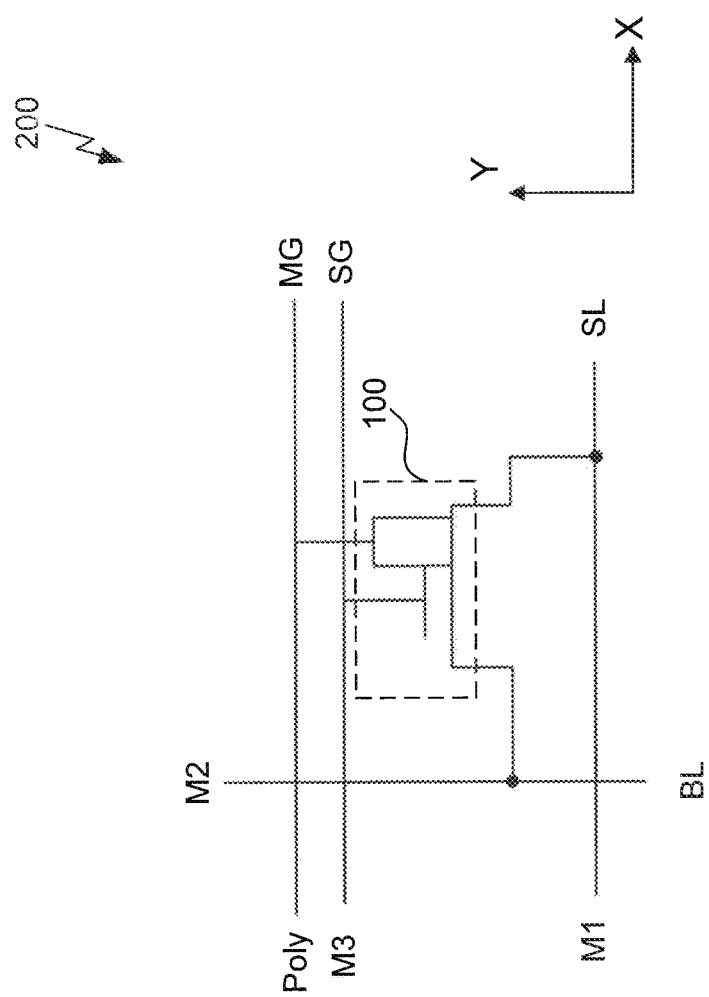
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
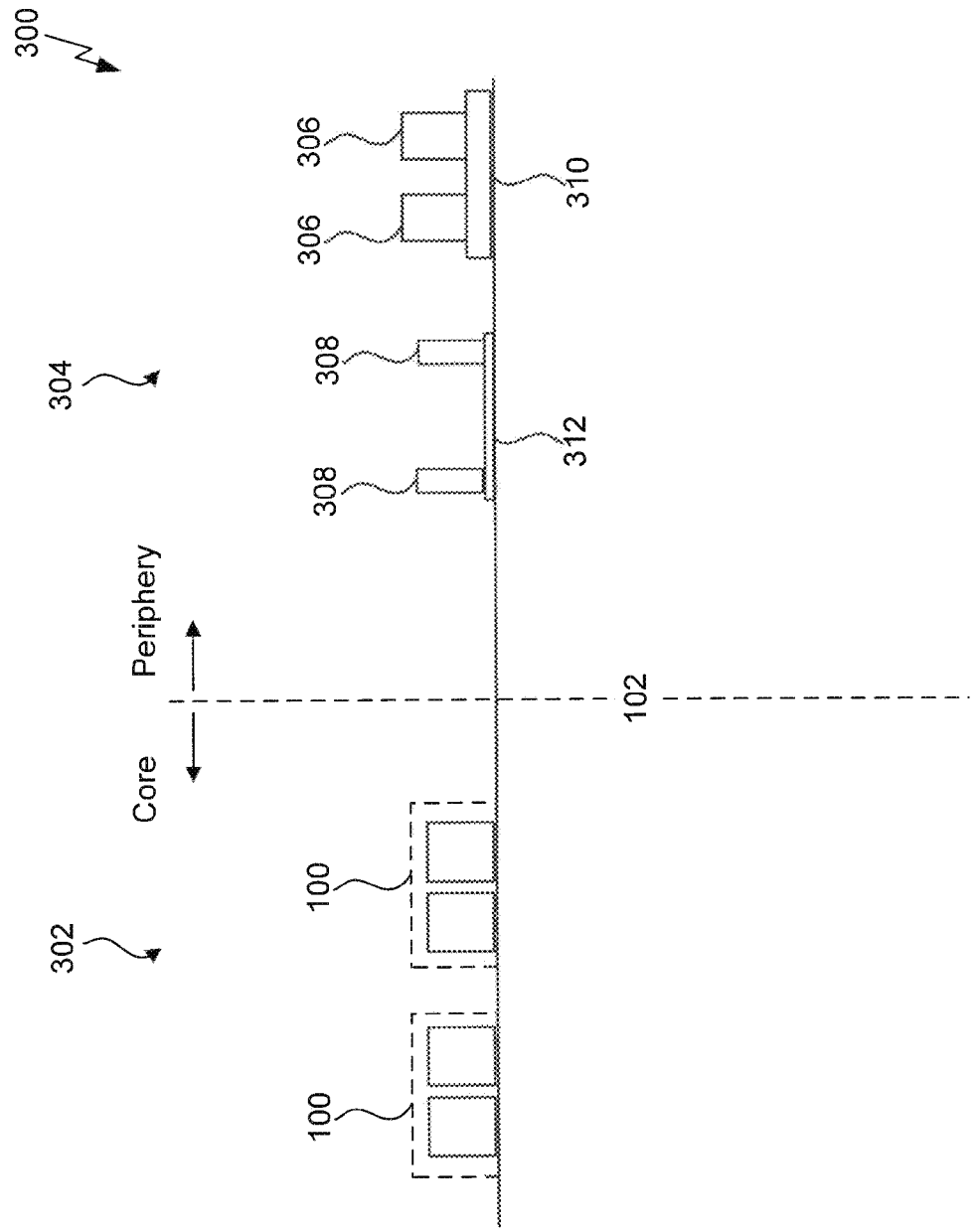
FIG. 3 depicts a cross-section of a semiconductor device according to various embodiments.

FIG. 3 illustrates an example semiconductor device 300 that includes both memory circuitry 302 and peripheral circuitry 304 in the same substrate 102. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Substrate 302—and indeed substrates in general as used throughout the description—can be silicon according to various embodiments. However, the substrate 302 may also be any of a wide array of semiconductor materials such as germanium, gallium arsenide, indium phosphide, etc. In other embodiments, the substrate 302 may be electrically non-conductive such as a glass or sapphire wafer.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308. As shown in FIG. 3, low voltage transistors 308 have a narrower width than high-voltage transistors 306, but this need not be the case. According to some embodiments, low-voltage 308 transistors can be wider than high voltage transistors 306 or, alternatively, low-voltage transistors 308 and high-voltage transistors 306 can have the same width.

During the descriptions herein, various regions of the substrate upon which the field-effect devices are fabricated are mentioned. For instance, with respect to FIG. 3, core region 302 and periphery region 304 were described. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

Figure 4:
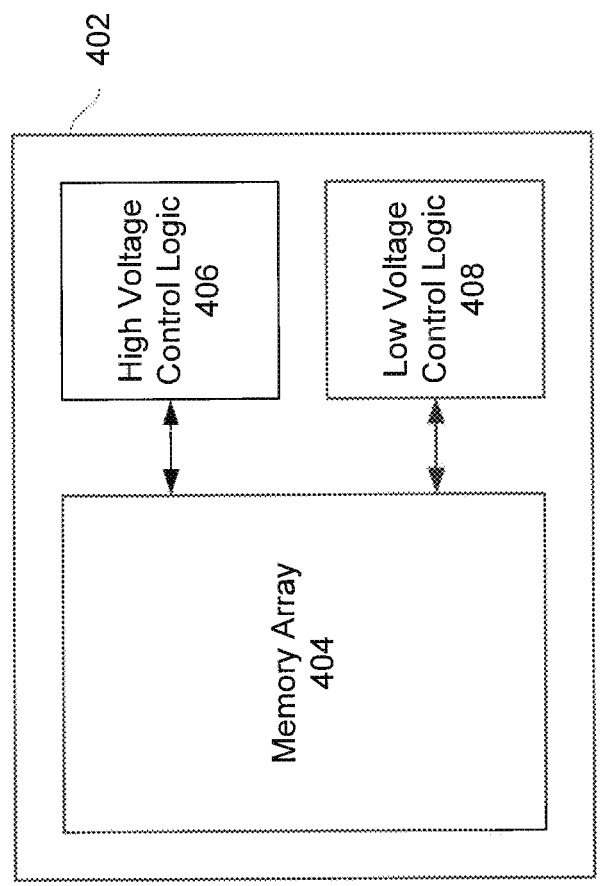
FIG. 4 is a functional block diagram of a memory device according to various embodiments.

FIG. 4 is a functional block diagram of a memory device 402 according to embodiments of the present invention. As shown, memory device 402 includes a memory array 404, high voltage control logic 406, and low voltage control logic 408. According to various embodiments, the memory array 404 may comprise a number of memory cells 100 and may be physically located in a core region 302 of memory device 402. High voltage control logic 406 may comprise a number of high-voltage transistors 306, which can be used to control and/or drive portions of the memory array 404. Additionally, the high voltage control logic 406 may be physically located in the periphery 304 of the memory device 402. Similarly to the high voltage control logic 406, the low voltage control logic 408 may comprise a number of low voltage transistors 308, which can be used to control and/or drive portions of the memory array 404. The low voltage control logic 408 may also be located in the periphery 304 of the memory device. According to various embodiments, the high voltage control logic 406 and the low voltage, control logic 408 are located in different portions of the periphery region 304.

Figure 5A:
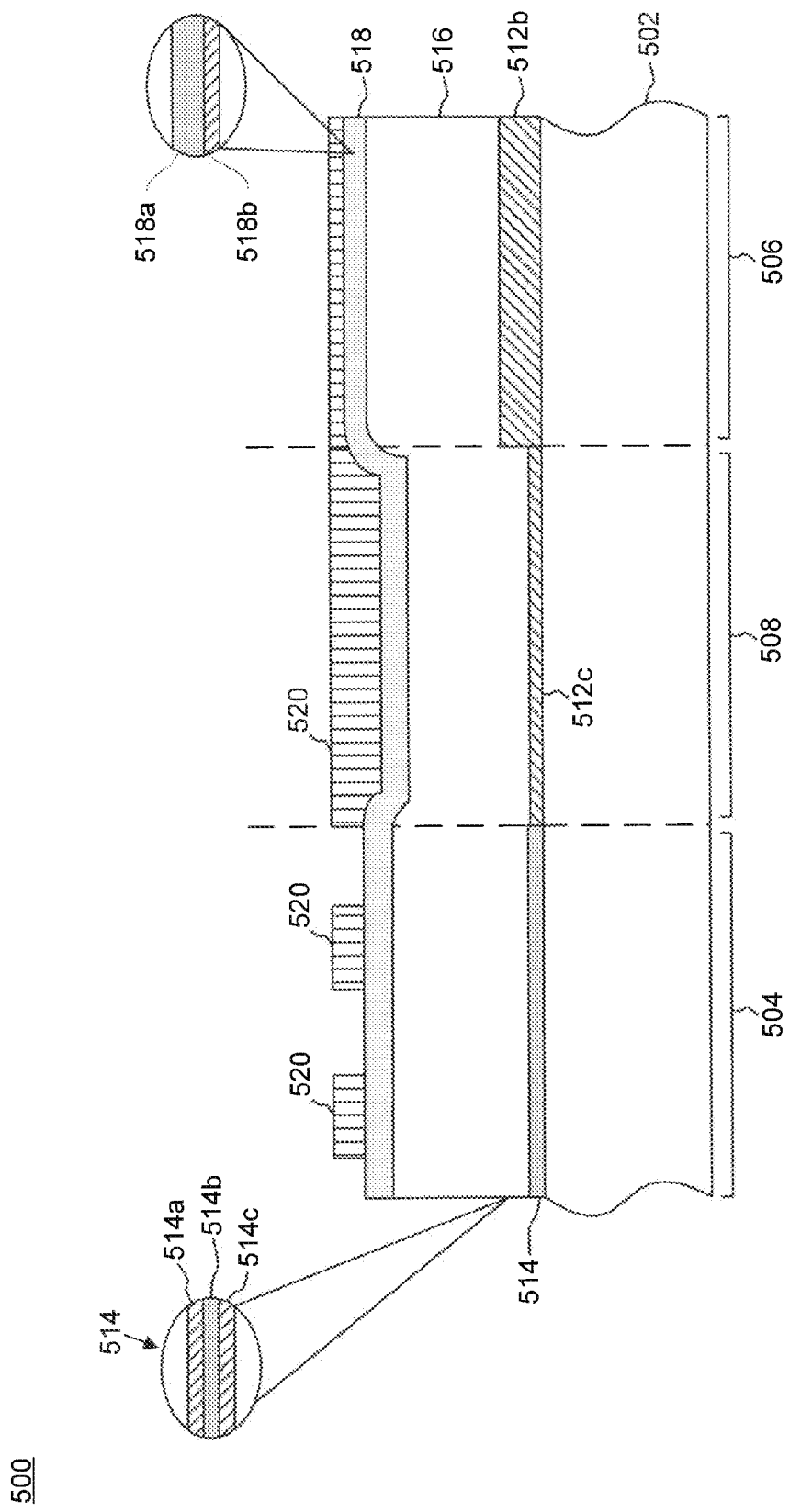

FIGS. 5A-5I depict a cross-section of a semiconductor device 500 at various points during its manufacture according to embodiments of the present invention. FIG. 5A depicts device 500 after a number of structures have been formed. As shown in FIG. 5A, the device 500 includes a substrate 502 which comprises three different regions 504, 506, and 508.

A first or memory region 504 of the substrate may be used for memory components. According to various embodiments, the first region 504 comprises a memory core region where a plurality memory cells (e.g., memory cell 100) can be formed. For instance, according to some embodiments, the first region may be used to form a number of select gate 108/memory gate 110 pairs.

Logic and/or control circuitry may be formed in periphery, which includes second and third regions 506 and 508, respectively according to various embodiments. The second region 506 may comprise the high voltage control logic region 406 and the third region 508 may comprise the low voltage control logic (e.g., region 408).

As shown in FIG. 5A, a gate dielectric 512b has been formed in second region 506 and another gate dielectric 512c has been formed in the third region 508. Gate dielectric 512a (not shown in this figure) can be created at a different time according to various embodiments. Each of the gate dielectrics 512a, 512b, and 512c may comprise any suitable dielectric material such as, for instance and oxide. According to various embodiments the gate dielectrics 512b and 512c may be different thicknesses, but this need not be the case. The gate dielectrics 512b and 512c may be formed through any well-known method. For instance, the dielectrics may be grown on the substrate 502 and comprise an oxide of the substrate material (e.g., silicon oxide). It is also possible, however, for the gate dielectrics 512b and 512c to be disposed on the substrate and comprise an oxide of a different material than the substrate. Additionally, dielectrics 512b and 512c may comprise the same or different material and may be formed at the same time or at different times according to various embodiments. A gate dielectric 512a (not shown in this figure) may later be disposed in the first region 504 according to various embodiments as well. The gate dielectric 512a may be thinner than either of the of the gate dielectrics 512a and 512b according to some embodiments, but it also may be the same thickness as either or both of gate dielectrics 512a and 512b.

A charge trapping dielectric 514 has been disposed above the substrate 502 in the first region 504, as shown in FIG. 5A. According to various embodiments, the charge trapping dielectric comprises one or more layers of dielectric such as ONO, as described above. For instance, the charge trapping dielectric 514 may comprise a first dielectric layer 514a, a charge trapping layer 514b, and a second dielectric layer 514c. Regardless of the specific composition of the charge trapping dielectric 514, it preferably contains at least one charge trapping layer 514b. The charge trapping layer may be formed of a nitride or silicon rich nitride, and may include multiple layers of different nitrides according to some embodiments.

A gate conductor layer 516 has been formed over all three regions 504, 506, and 508 of the device 500. According to various embodiments, the gate conductor layer 516 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

A cap layer 518 has been formed over all three regions 504, 506, and 508 of device 500. According to various embodiments, the cap layer 518 may comprise a layer of nitride 518a disposed on over a layer of dielectric 518b. A mask 520 is disposed over the second region 506 and the third region 508. Mask 520 may additionally be patterned in the first region 504. Both mask 520 may comprise any suitable material that allows for selective removal (e.g., etching) of the unmasked portion of the gate conductor layer 516. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Figure 5B:
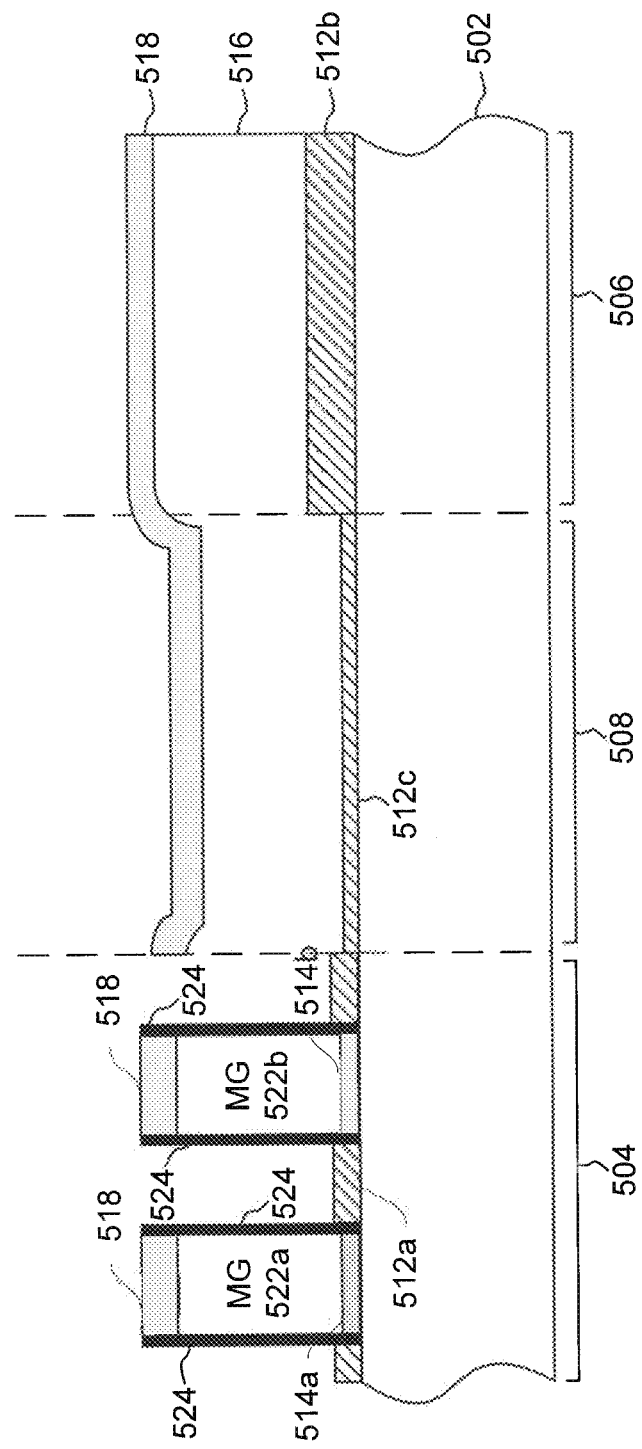

FIG. 5B depicts a cross section of device 500 after the gate conductor 516 is removed from the unmasked portion of the first region. Additionally, the charge trapping dielectric 514 disposed between memory gates 522a and 522b is removed. According to some embodiments, the removed portion of the gate conductor 516 and the charge trapping dielectric 514 is removed by any of a number of appropriate etching methods. For instance, the gate conductor layer 516 may be etched using Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

As depicted in FIG. 5B, the remaining portions of the gate conductor 516 in the first region 504 form memory gates 522a/522b. Additionally, a dielectric 524 has been formed on the sidewalls of the memory gates and the charge tapping dielectric 514. According to various embodiments, the dielectric may comprise a single layer dielectric or a multiple layer dielectric such as ONO, described above. Additionally, a select gate dielectric 512a may be grown in the first region 504 according to various embodiments.

Figure 5C:
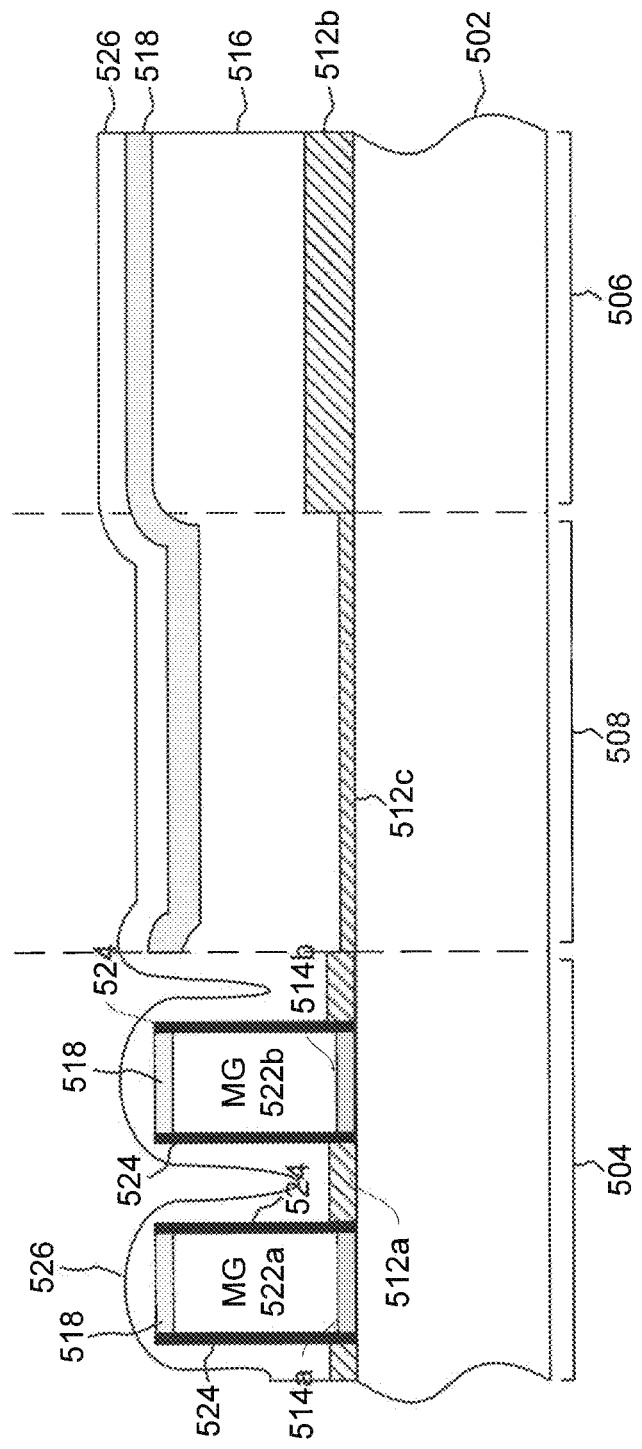

In FIG. 5C, a second gate conductor layer 526 has been formed over the memory gates 522 in the first region 504. According to some embodiments, the second gate conductor layer 526 may be substantially conformal to the other structures formed in the first region, but this need not be this case in all embodiments. Second gate conductor layer 526 has also been formed over the second region 506 and the third region 508, as shown in FIG. C.

Figure 5D:
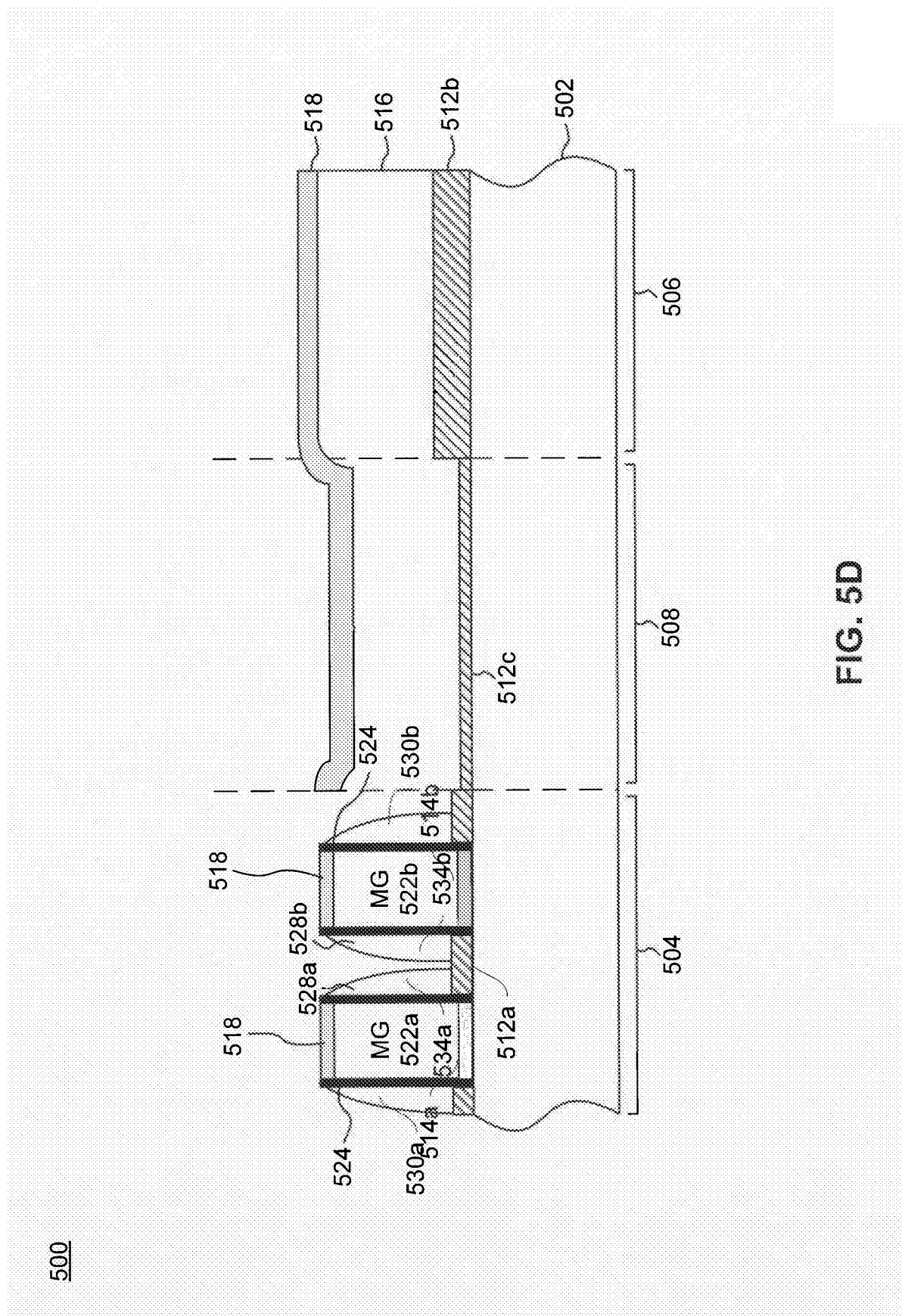
Figure 5F:
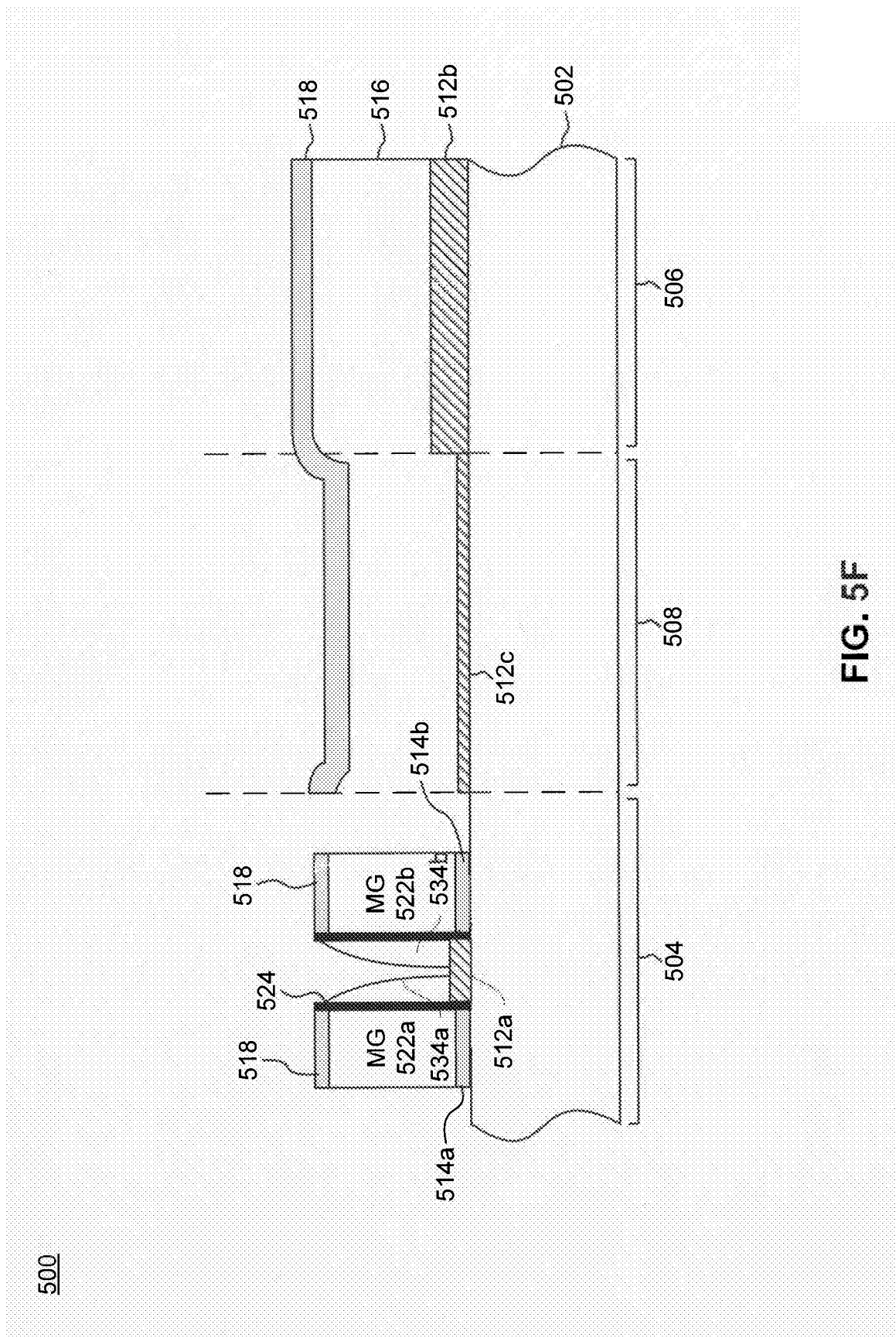

FIG. 5D depicts the partial removal of the second gate conductor layer 526. As can be seen, a portion of the second gate conductor layer 526 remains disposed on the sidewalls of the memory gates 522a and 522b. Gate conductor portions 528a and 528b will eventually comprise the select gates for memory cells to be formed using memory gates 522a and 522b. Portions 530a and 530b, however, are superfluous. Superfluous portions 530a and 530b can be removed by masking portions 528a and 528b with mask 532, as shown in FIG. 5E. Once masked, the superfluous portions 530a and 530b can be removed as well as the unmasked portion of dielectric 524. The result of this removal is depicted in FIG. 5F.

Figure 5G:
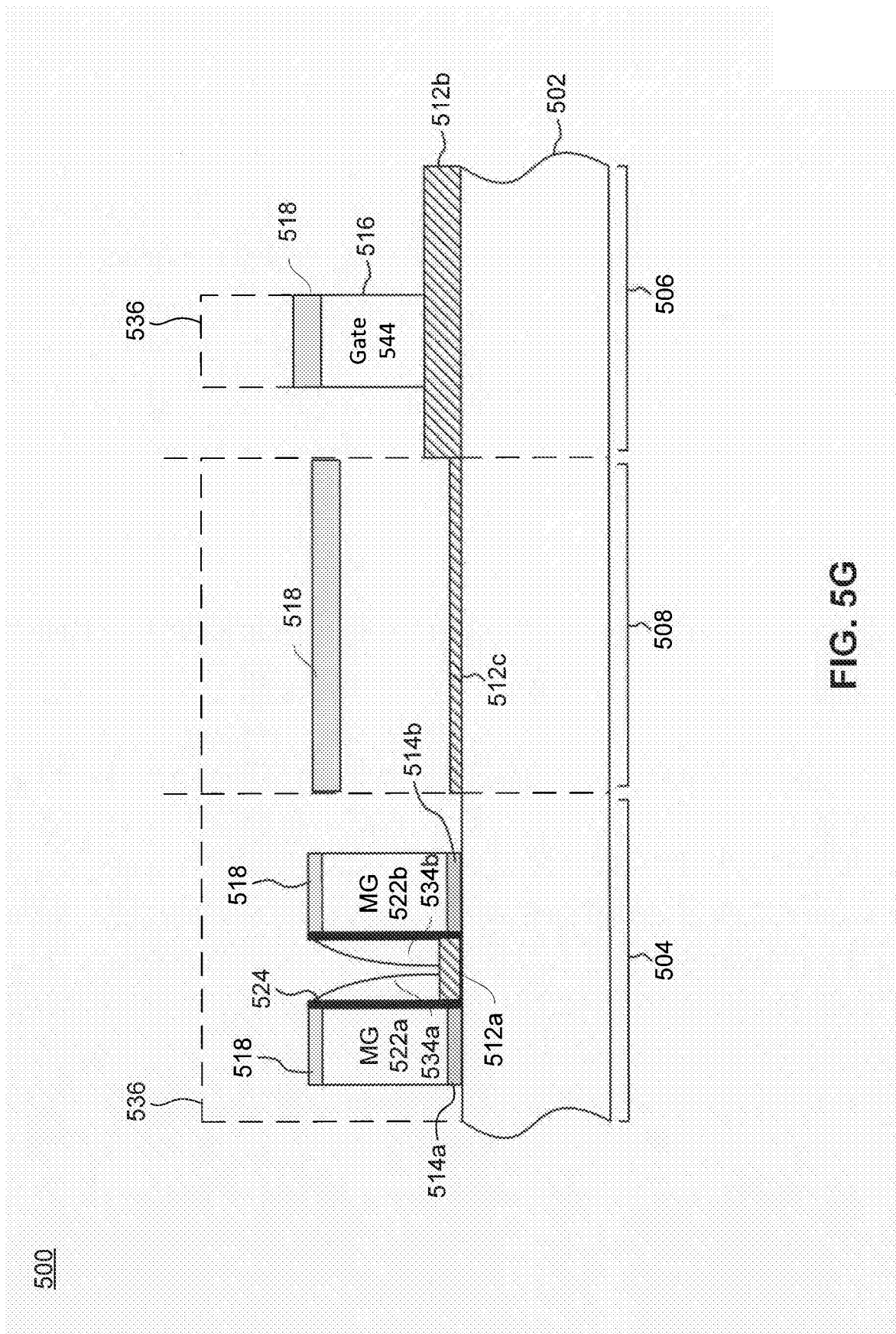

FIG. 5G depicts a cross section of device 500 after several additional steps have been performed according to various embodiments. In FIG. 5G, the first and third regions 504 and 508 are masked with mask 536. Additionally, mask 536 may be patterned over second region 506 over cap layer 518. The portion of cap layer 518 and of the second gate conductor 516 not beneath the patterned mask 536 is removed from the second region 506, as shown. After gate 544 in the second region is defined, the lightly doped drain and source masks and implants are performed to form the junctions next to gates 544. After the scenario depicted in FIG. 5G, mask 536 can be removed from the device 500 and the nitride portion 518a can be removed from the cap layer 518 in all three regions using, for instance, a nitride wet strip.

Figure 5H:
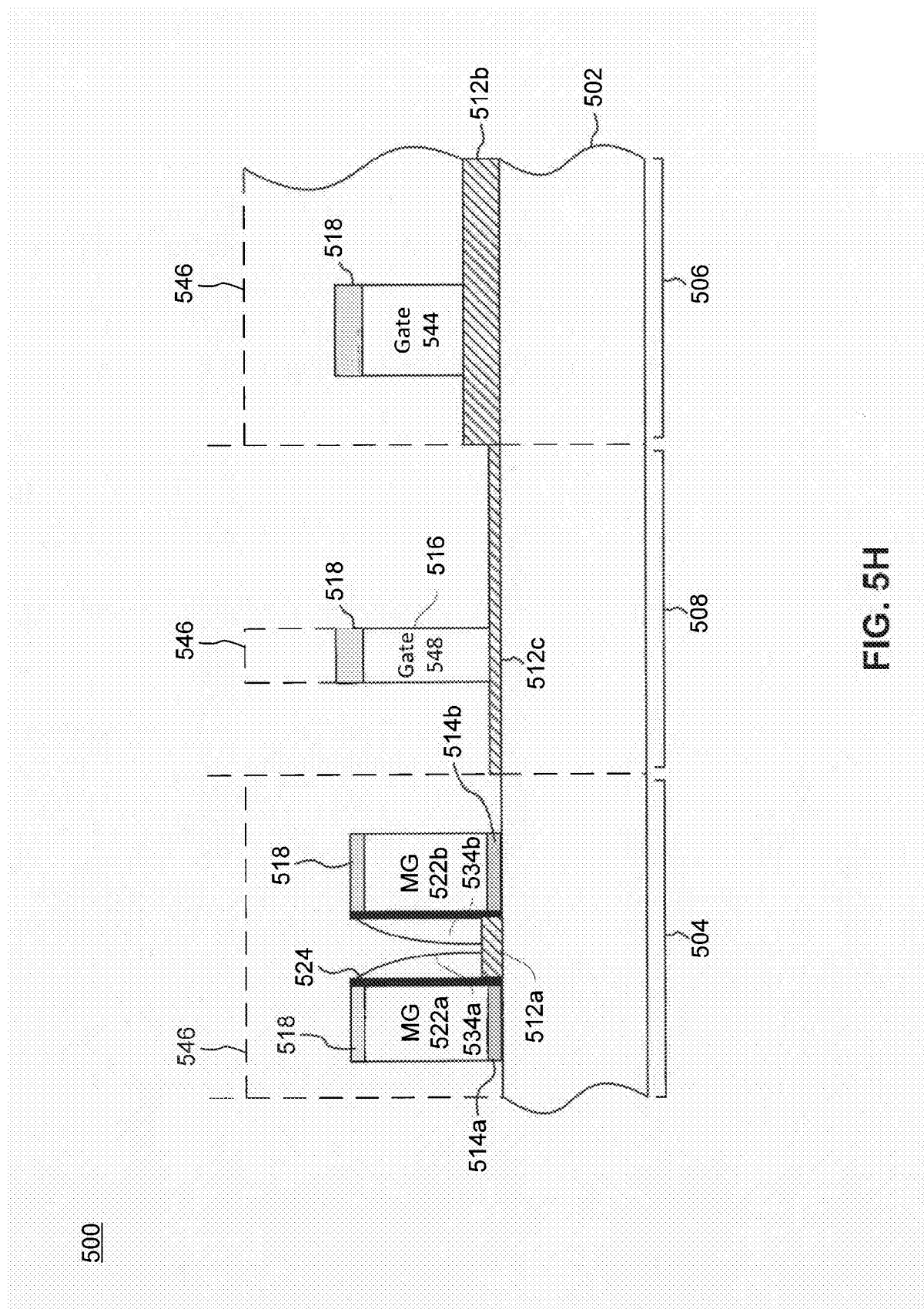

FIG. 5H depicts a cross section of device 500 after gate 544 has been defined by the removal of a portion of the second gate conductor 516 from the second region 506. Additionally, a mask 546 has been disposed in the second region 506 in order to protect the gate 544 from the process steps of forming logic gates in the third region 508. Additionally, mask 546 has been patterned in the third region 508 in order to facilitate formation of a gate 548 in the third region 508.

FIG. 5I depicts a cross section of device 500 after a second logic gate 548 has been defined in the third region 508. Additionally, mask 546 is removed from the first region 504 and the second region 506. Any remaining portions of cap layer 518 are also shown as removed. At this point device 500, thus, comprises a pair of memory cells 550a d 550b disposed in the first region 504 of the device 500. Each of the memory cells 550a and 550b comprises a memory gate 522a and 522b (generally referred to herein as "memory gate 522") and a select gate 534a and 534b, respectively. A dielectric 524a and 524b disposed on a sidewall of the memory gate electrically isolates the select gates 534a and 534b from their associated memory gates 522a and 522b. Charge trapping dielectrics 514a and 514b are disposed beneath the memory gates 522a and 522b. As discussed above, the charge trapping dielectrics 514a and 514b may comprise one 01 more dielectric layer that includes a charge trapping layer. Additionally, the charge trapping dielectrics 514a and 514b are separate and independently formed form the sidewall dielectrics 524a and 524b.

In addition to the memory cells 550a and 550b, the device 500 comprises a first gate 544 disposed in the second region 506 and a second gate 548 disposed in the third region 508. According to various embodiments, the second region may be configured to accommodate high-voltage circuitry and logic and, accordingly, the gate 544 may be designed to handle high-voltage. For instance, gate 544 may be longer than gate 548 in order to facilitate the use of higher current in the second region 506. Third region 508 may be configured to accommodate relatively lower voltage logic and/or circuitry. Accordingly, gate 548 may be thinner than gate 544 according to various embodiments.

It should be understood, that FIGS. 5A-5I depict a simplified version of device 500 with only a pair of memory cells 550a and 550b and a single logic gate 542 and 540 in each of the second region 506 and the third region 508 for ease of explanation. A person of ordinary skill in the art, however, would understand that device 500 could contain a large number of memory cells, logic cells, and other components in each of the first region 504, second region 506, and third region 508.

Figure 6A:
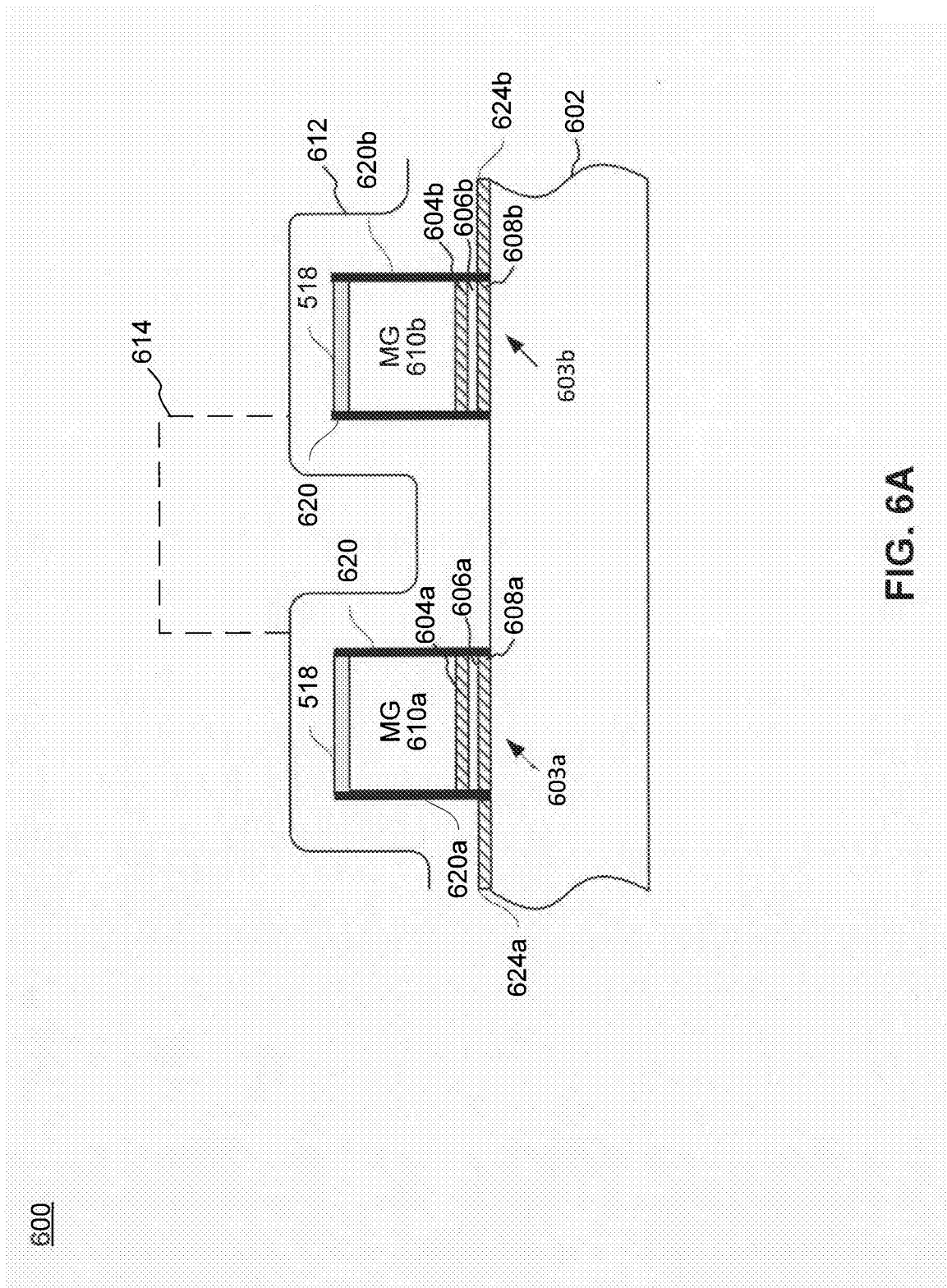
FIGS. 6A-6D depict a cross-section of a memory device at various points during its manufacture according to various embodiments.

FIGS. 6A-6D depict an alternative to the method of forming the select gates 534a and 543b on the sidewalls of the memory gates 522a and 522b depicted in FIGS. 5A-5I. As shown in FIG. 6A, device 600 may comprise a substrate 602 and memory gates 610a and 610b. Disposed between each of the memory gates 610a and 610b is a charge trapping dielectrics 603a and 603b. In this case, the charge trapping dielectrics 603a and 603b each comprise a top dielectric 604a and 604b, a nitride layer 606a and 606b, and a bottom dielectric 608a and 608b. According to some embodiments the bottom dielectric 608a and 608b may be in addition to an additional gate dielectric (not shown). According to various embodiments, the top dielectrics 604a and 604b and the bottom dielectrics 608a and 608b may comprise oxides of any suitable material such as silicon oxide. Additionally, the charge trapping dielectrics may comprise additional layers. For instance, it may be desirable to include multiple nitride layers 606a and 606b to act as charge trapping layers. The dielectric layers 604a, 604b, 608a, and 608b may comprise dielectrics of the substrate or some other material and may be formed according to any of a number of conventional means. The nitride layers 606a and 606b may comprise silicon nitride, silicon rich nitride, or any material suitable to act as a charge trapping layer.

FIG. 6A also depicts a dielectrics 620a and 620b (collectively referred to as dielectric 620 herein) disposed on the sidewall memory gate structures 610a and 610b. Dielectric 620 may comprise a single layer of dielectric or multiple layers such as the ONO described above. Over the dielectric 620, and the memory gate structures 610a and 610b, a layer of gate conductor 612 is disposed. Additionally, a mask 614 has been formed over a portion of the gate conductor 612 disposed on the inner sidewalls of the memory gates 610a and 610b.

Figure 6B:
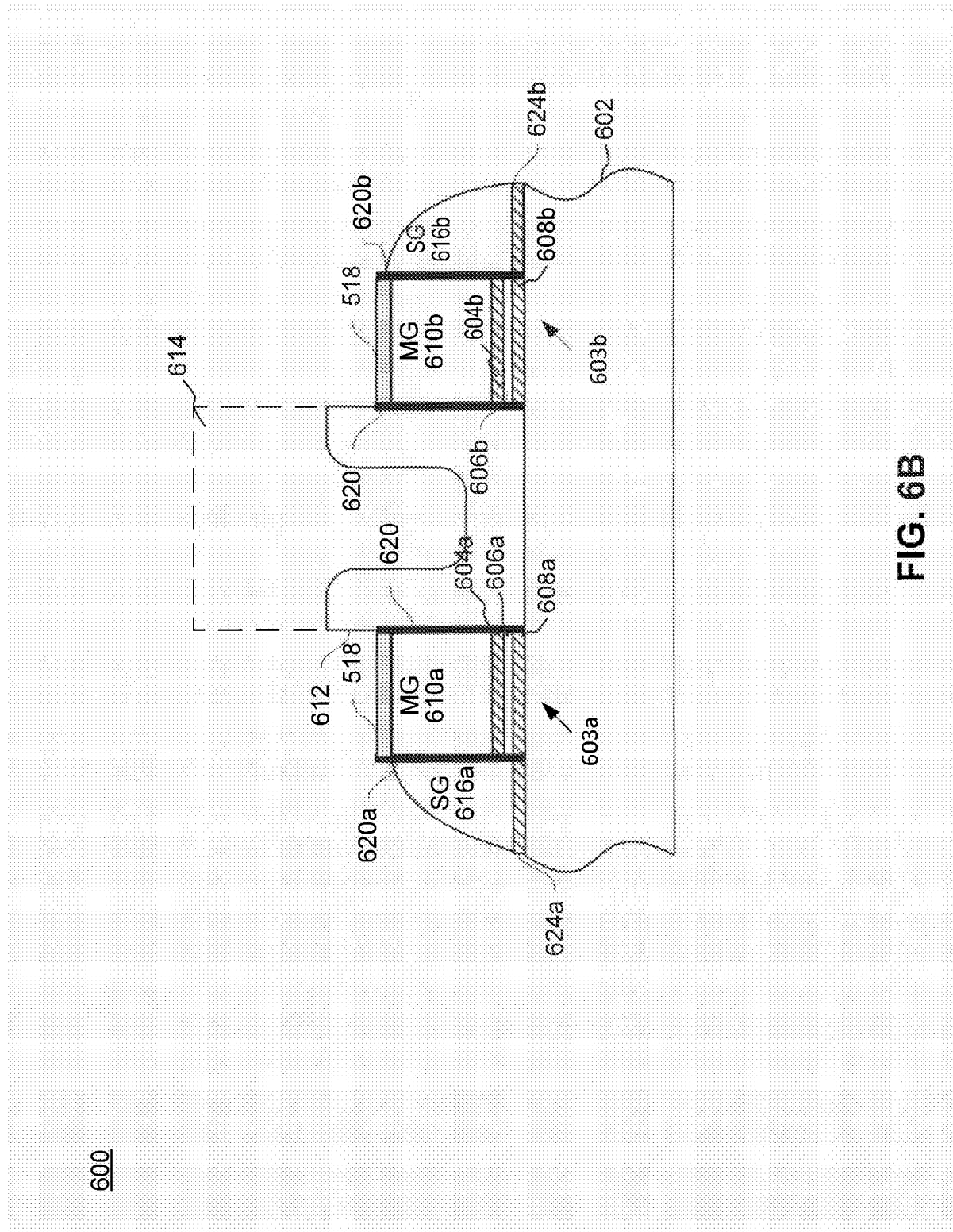

As shown in FIG. 6B, a portion of the gate conductor layer 612 can be removed from the unmasked area of device 600. However, some of the gate conductor in the unmasked portion is purposefully not removed on the outer sidewalls of the memory gates 610a and 610b. The retained portion of the gate conductor 612 on the outer sidewalls of memory gates 610a and 610b will form the select gates 616a and 616b.

Figure 6C:
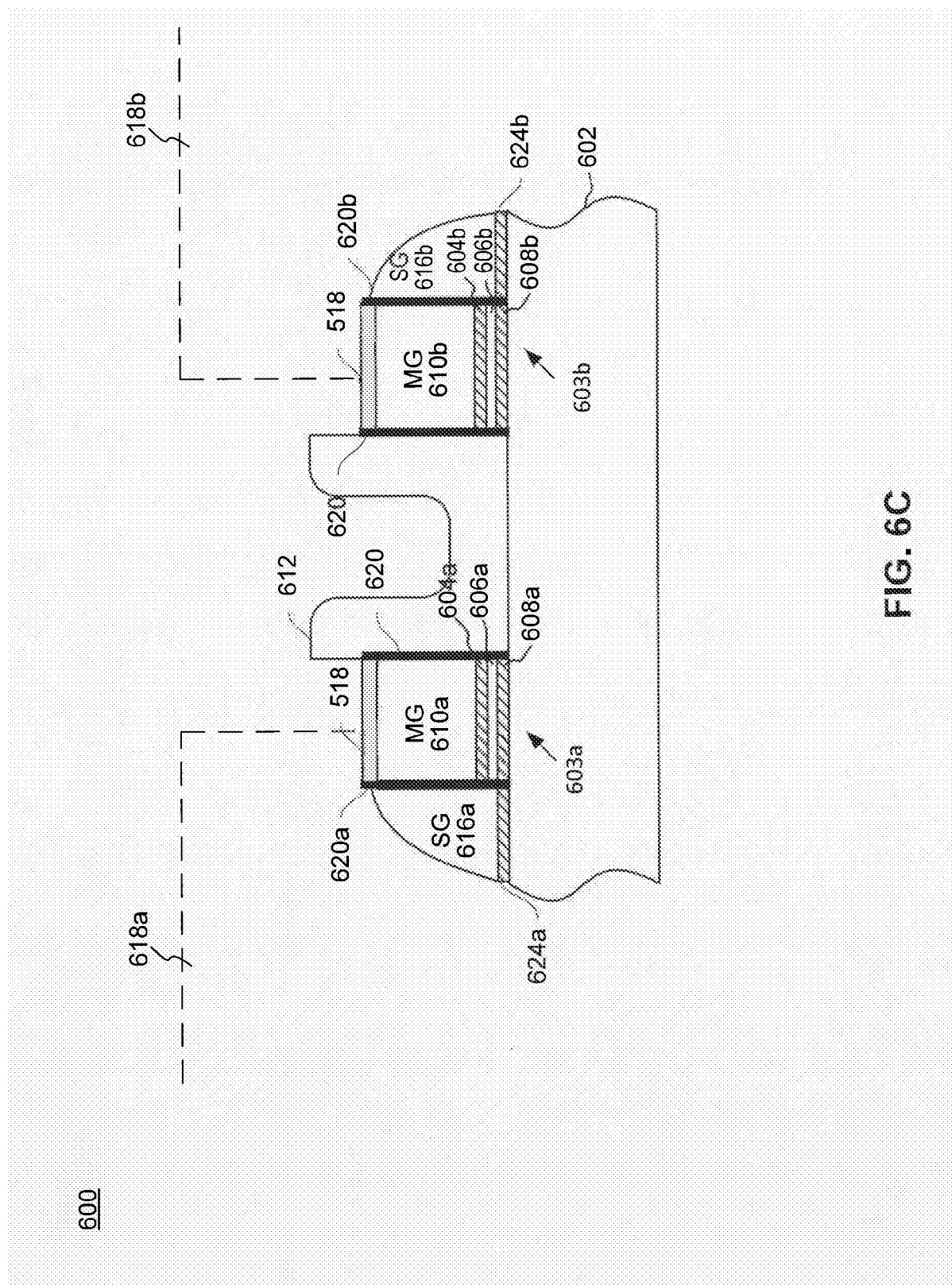

As shown in FIG. 6C, mask 614 is removed leaving gate conductor 612 exposed. Additionally, new masks 618a and 618b have been formed over the select gates 616a and 616b and a portion of memory gates 610a and 610b. The remaining gate conductor 612 can then be removed from the inner sidewall portion of memory gates 610a and 610b, as is shown in FIG. 6D.

Figure 6D:
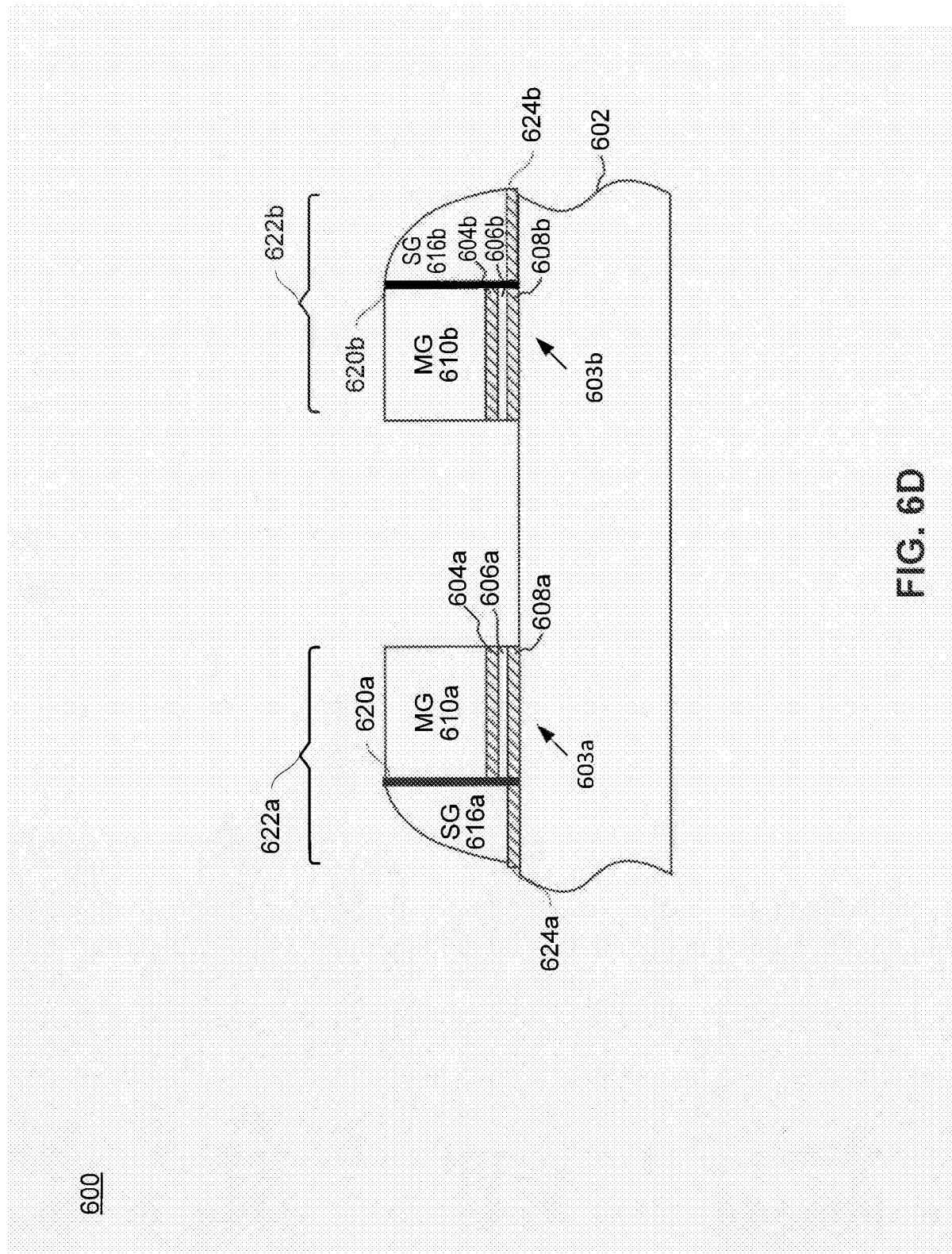

FIG. 6D depicts two split-gate memory cells 622a and 622b formed according to the alternative process depicted in FIGS. 6A-6D with the cap layer 518 on 610a and 610b removed. Additionally, as shown in FIG. 6D dielectric 620 is removed from the sidewalls between the memory gates 610a and 610b. As shown in FIG. 6D, each of the split-gate memory cells includes a memory gate 610a and 610b disposed above a charge trapping dielectric 603a and 603b. The charge trapping dielectric 603a and 603b is itself comprised of several dielectric layers. For instance, the charge trapping dielectric may include a top dielectric layer 604a and 604b, a nitride layer 606a and 606b, and a bottom dielectric layer 608a and 608b, as shown.

A select gate 616a and 616b has been formed a sidewall of each of the memory gates 610a and 610b. A dielectric 620a and 620b electrically isolates the select gates 616a and 616b from the memory gates 610a and 610b. According to various embodiments, the dielectric 620a and 620b may comprise one or more dielectric layers, but has been formed independently of the charge trapping dielectric 603a and 603b.

For simplicity's sake, FIGS. 5A-5I and 6A-6D do not expressly depict source and drain regions in devices 500 and 600. However, it should be understood that appropriate source and drain regions (e.g., regions 104 and 106) would be formed in devices 500 and 600 during the manufacturing process by any appropriate method such as ion implantation, for example.

Figure 7:
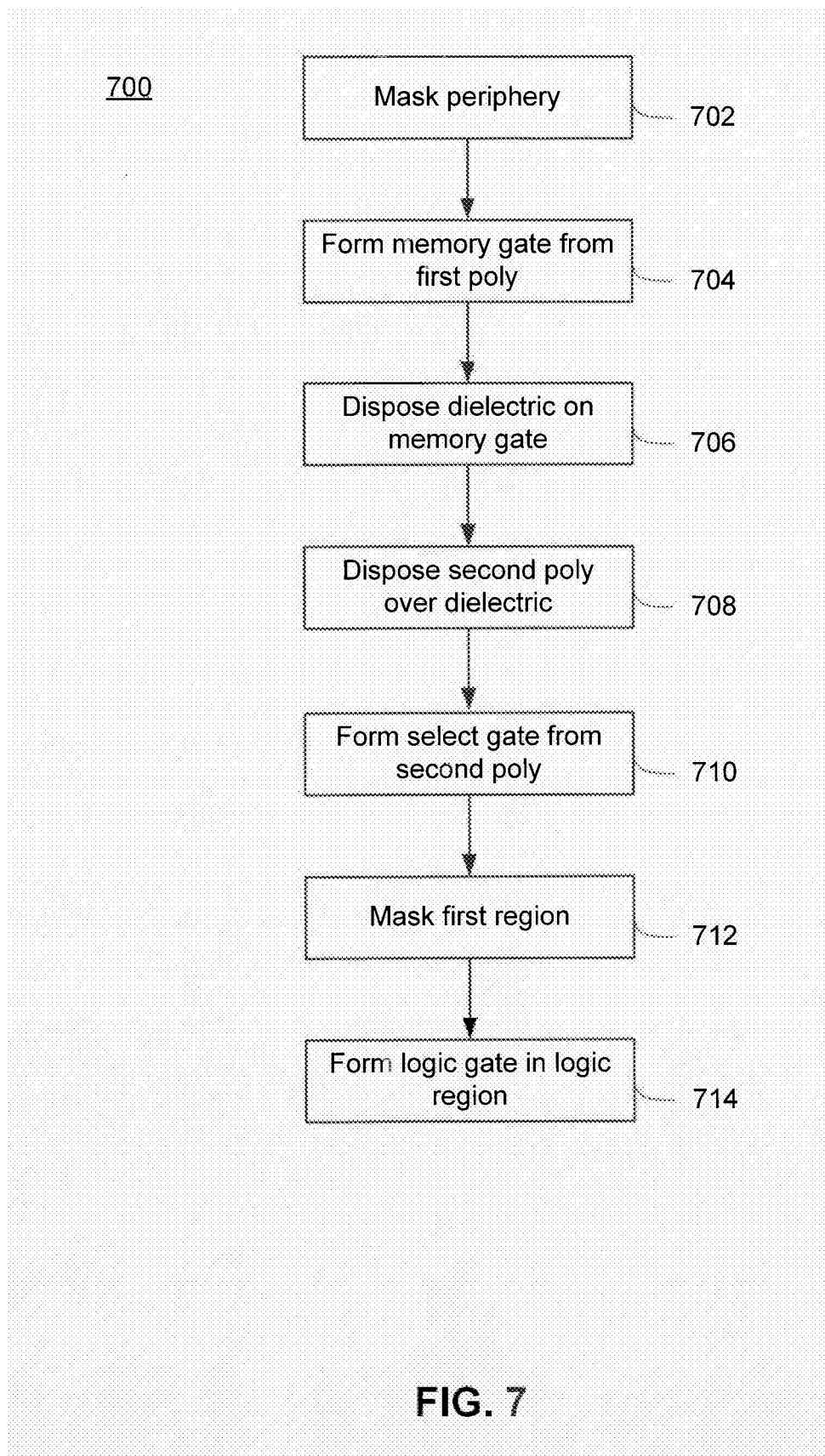
FIG. 7 is a flowchart depicting a method of manufacturing a semiconductor device according to various embodiments.

FIG. 7 is a flowchart depicting a method 700 of forming a semiconductor device according to various embodiments. The discussion of FIG. 7 will make reference to FIGS. 5A-5I, but it should be understood that method 700 is not limited to the specific embodiment depicted in FIGS. 5A-5I, but is more generally applicable.

As shown in FIG. 7, the method 700 may begin by masking a peripheral region of the device 500 at step 702. The peripheral region may include any portion of the device 500 that is not the memory region or first region 504. For instance, in device 500, the peripheral region could include second region 506 and third region 508.

According to various embodiments, step 702 may occur after gate dielectrics 512a, 512b, and 512c have been formed in each of the first region 504, second region 506, and third region 508. Additionally, prior to performing step 702, a charge trapping dielectric may be formed in the first region 504. As described above, the charge trapping dielectric may comprise one or more layers of dielectric such as ONO, as described above. For instance, the charge trapping dielectric 514 may comprise a first dielectric layer 514a, a nitride layer 514b, and a second dielectric layer 514c. In addition to the charge trapping layer, a first, gate conductor layer 516 may be formed in each of the first region 504, the second region 506, and the third region 508 prior to performing step 702.

At step 704, a memory gate 522 can be formed from a first gate conductor 516. This can be accomplished by masking a portion of the gate conductor 516 in the first region 504 and etching the unmasked gate conductor 516 to define a memory gate 522. Additionally, it should be noted, that the portion of the charge trapping layer not beneath the memory gate 522 can also be removed from the first region 504 by, for instance, etching during the process of forming the memory gate 522.

At step 706, a dielectric 524 is disposed on a sidewall of memory gate 522. The dielectric 524 may comprise one or more dielectric layers. For instance, the dielectric 524 may include a nitride layer and one or two dielectric layers. The dielectric can be disposed on the sidewall of the memory gate 522 by, for instance, forming a dielectric layer over the memory gate, then dry etching to remove any of the dielectric 524 that is not on the sidewall of the memory gate 522. Additionally, a select gate dielectric 512a may be formed in the first region at this time according to various embodiments.

At step 708, a second gate conductor layer 526 is disposed over the dielectric 524. According to some embodiments, the second gate conductor layer 526 may be substantially conformal to the other structures formed in the first region, but this need not be this case in all embodiments.

At step 710, a select gate 534 is formed from the second gate conductor 526. According to some embodiments. The select gate 534 can be formed by removing gate conductor from the first region 504, while retaining a portion of the second gate conductor layer 526 remains disposed on the sidewalls of the memory gate 522. A superfluous portion 530 of the gate conductor 526 can be removed form one of the sidewalls of the memory gate by masking a select gate portion 534 and etching the rest. At step 712, the first region, which now contains a largely completed memory cell, can be masked to allow the formation of a logic gate in the second region 506 at step 714.

Figure 8:
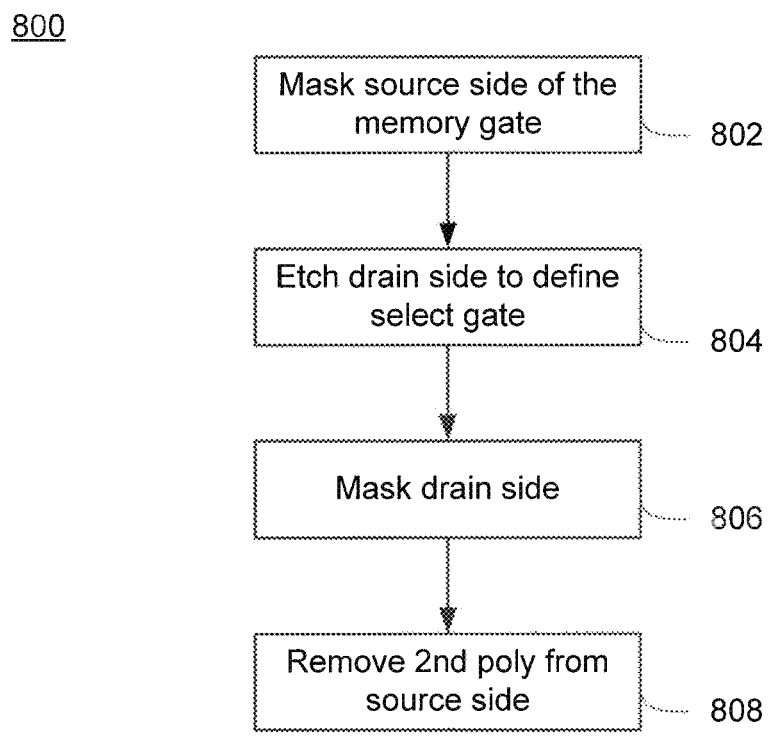
FIG. 8 is a flowchart depicting a method of manufacturing a semiconductor device according to various embodiments.

FIG. 8 is a flowchart depicting a method 800 of forming a select gate according to various embodiments. The discussion of FIG. 8 will make reference to FIGS. 6A-6D, but it should be understood that method 800 is not limited to the specific embodiment depicted in FIGS. 6A-6D, but is more generally applicable.

According to method 800, a source side of memory gate 610 is masked at step 802. Prior to performing step 802, however, a device 600 may be formed. Device 600 may comprise, a substrate 602 and memory gates 610a and 610b (referred to in general as "memory gate 610" herein). Disposed between each of the memory gate 610 and the substrate is a charge trapping dielectric 603. The charge trapping dielectrics 603 may include a top dielectric 604, a nitride layer 606, and a bottom dielectric 608. According to some embodiments the bottom dielectric 608 may be in addition to an additional gate dielectric. Additionally, the charge trapping dielectric 603 may comprise additional layers. For instance, it may be desirable to include multiple nitride layers 606 to act as charge trapping layers. The dielectric layers 604 and 608 may comprise oxides of the substrate or some other material and may be formed according to any of a number of conventional means. The nitride layer 606 may comprise silicon nitride, silicon rich nitride, or any material suitable to act as a charge trapping layer.

A dielectric 620 may also have been disposed over the memory gate structure 610 prior to step 802. Dielectric 620 may comprise a single layer of dielectric or multiple layers such as the ONO described above. Over the dielectric 620, a layer of gate conductor 612 is disposed. Additionally, a gate conductor layer 612 may be disposed over the memory gate structure 610 prior to performing step 802.

At step 804, a drain (unmasked in this case) is removed (e.g., etched) to define a select gate 616 on the sidewall of the memory gate 610. The select gate 616 can be defined by removing a portion of the gate conductor 612 from the unmasked region. However, some of the gate conductor 612 is purposefully left on the sidewall of the memory gate 610 in order to form the select gate 616.

At step 806, the drain side of the memory gate can be masked to protect the select gate 616. Next, the remaining gate conductor 612 can be removed from the source side of the memory gate at step 808.

Figure 9:
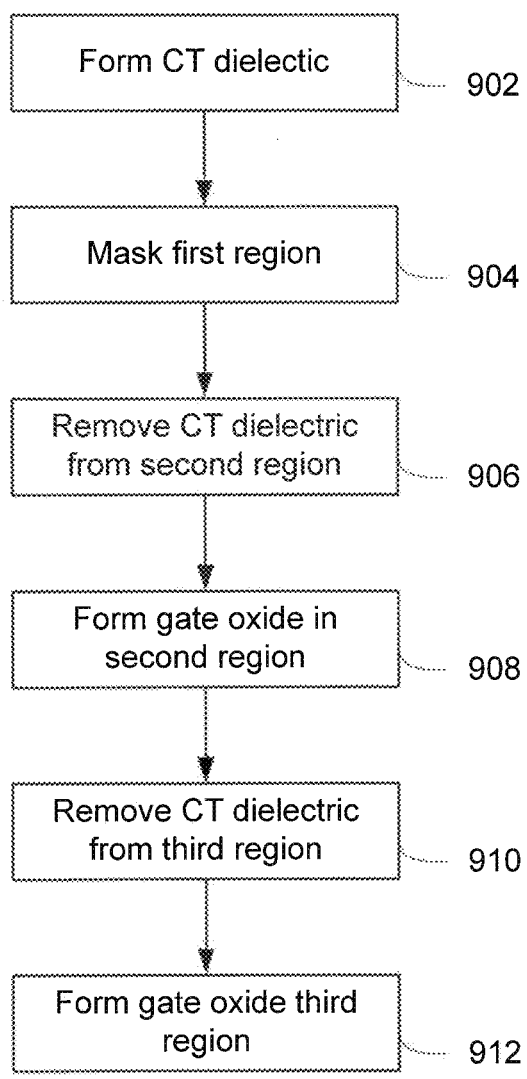
FIG. 9 is a flowchart depicting a method of manufacturing a semiconductor device according to various embodiments.

FIG. 9 is a flowchart depicting a method 900 for forming a charge trapping dielectric in a first region 504 of a semiconductor device 500 according to various embodiments. The device 500 may include a first region 504, a second region 506, and a third region 508 as depicted, for instance, in FIGS. 5A-5I.

At step 902, the charge trapping dielectric 514 is formed in each of the first region 504, the second region 506, and the third region 508. The charge trapping dielectric may include one or more dielectric layers according to various embodiments. For instance, according to some embodiments, the charge trapping dielectric may include a top dielectric 514a, a nitride layer 514b, and a bottom dielectric 514c. Additionally, the step of forming the charge trapping dielectric may comprise depositing each of the top dielectric 514a, the nitride layer 514b, and the bottom dielectric 514c separately.

At step 904, the first region 504 is masked to protect it from process steps that will be carried out in the second region 506 and the third region 508. At step 906, the charge trapping dielectric 514 is removed from the second region and a gate dielectric 512b can be formed at step 908.

At step 910, the charge trapping dielectric 514 can be removed from the third region and a gate dielectric 512c can be formed in the third region at step 912. After step 912, the device 500 includes a charge trapping dielectric in the first region separately formed gate dielectrics 510b and 510c in the second region 506 and the third region 508.

Figure 10:
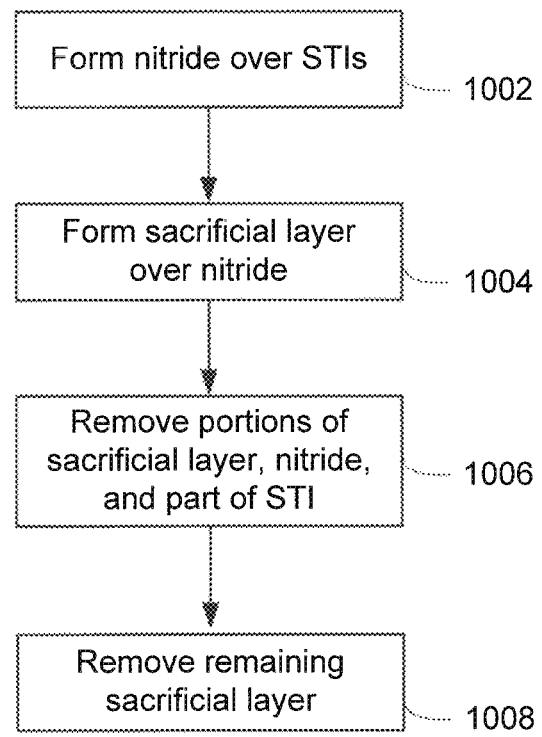
FIG. 10 is a flowchart depicting a method of manufacturing a semiconductor device according to various embodiments.

As noted above, according to some embodiments, silicon rich nitride (SiRN) can be used for the charge trapping layer 514b. SiRN can be advantageous to use as the charge trapping layer in a split-gate memory cell because it has been found to have better reliability, a faster erase speed, and a lower erase current. While SiRN has some properties that make it good to use as the charge trapping layer 514b, it also has some properties that make it difficult to use. For instance, unlike other nitrides, SiRN is slightly conductive. Accordingly, it is important to ensure that the charge trapping layer 514b of each memory cell (e.g., 550a or 550b) is isolated from the other memory cells in order to avoid leakage. FIG. 10 is a flowchart depicting a method 1000 of isolating the charge trapping layers in each of the memory cells from each other according to various embodiments. FIGS. 11A-11E depict a semiconductor device 1100 at various points during method 1000. Accordingly, FIG. 10 will be discussed in conjunction with FIGS. 11A-11E.

Figure 11A:
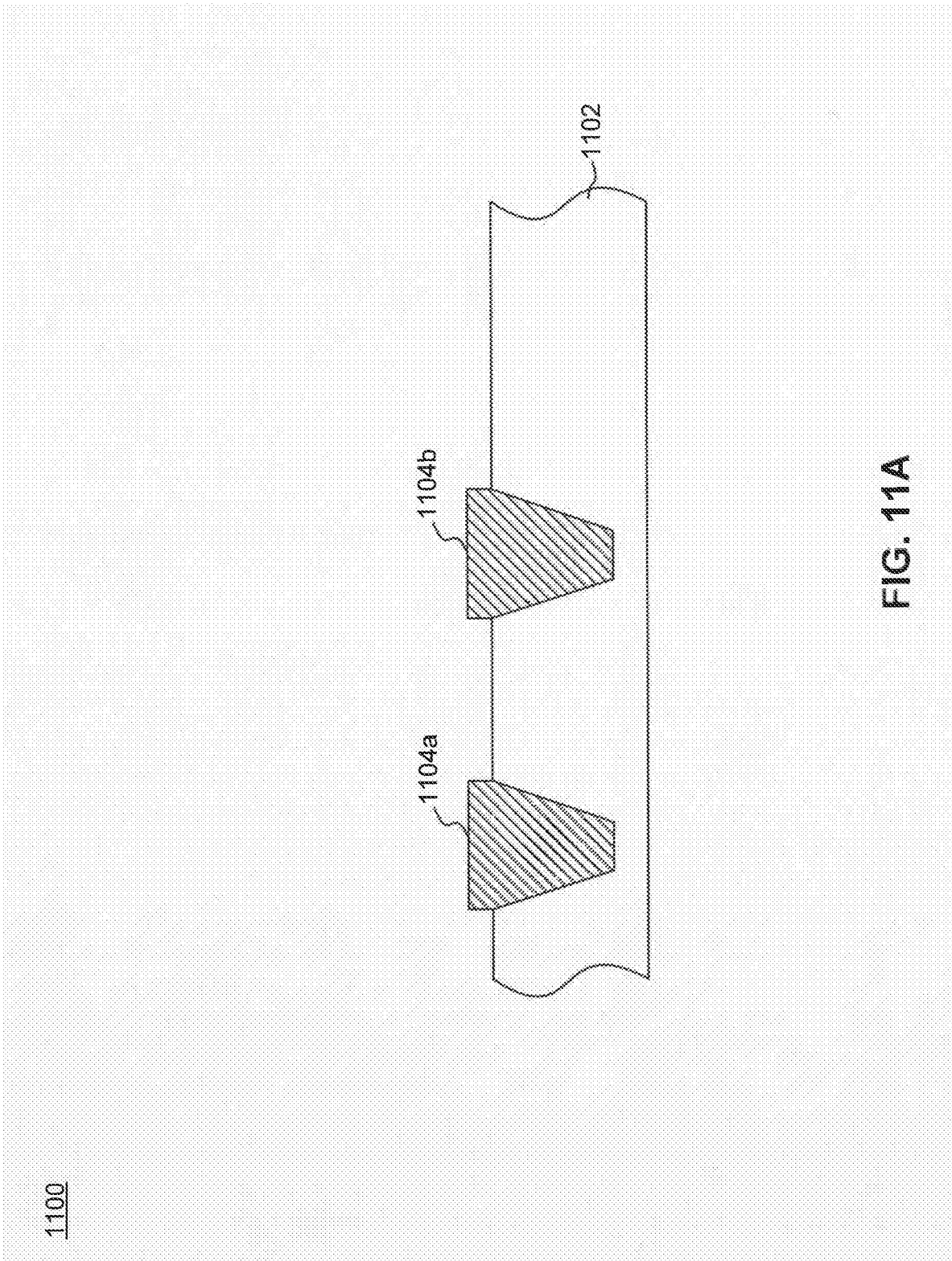
FIGS. 11A-11E depict a cross-section of a memory device at various points during its manufacture according to various embodiments.

FIG. 11A depicts a semiconductor device 1100. The device 1100 includes a substrate 1102 and shallow trench isolation (STI) regions 1104a and 1104b (collectively referred to herein as STI regions 1104). STI regions 1104 function to electrically isolate adjacent semiconductor components (not shown) from each other.

Figure 11B:
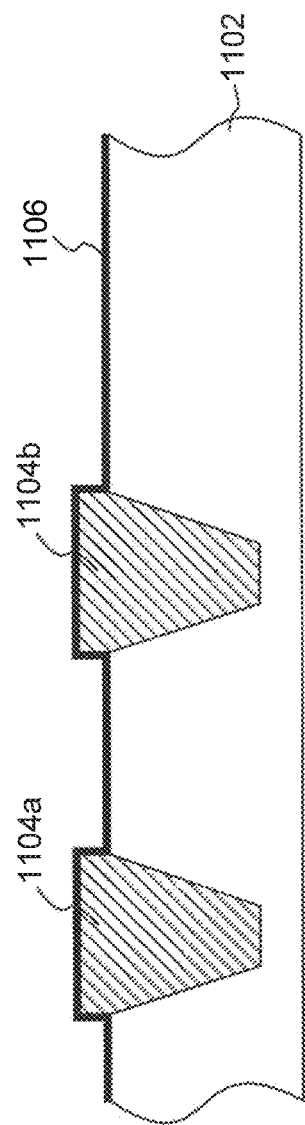
Figure 11C:
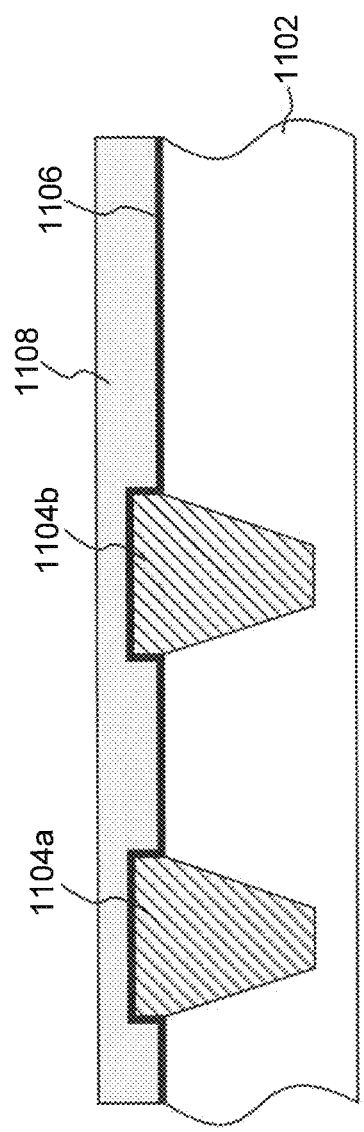

According to method 1000, at step 1002, a nitride layer 1106 is formed over the STI regions 1104 of the semiconductor device 1100 after bottom dielectric. The result of this step is depicted in FIG. 11B. The nitride layer 1106 may comprise SiRN or any other suitable nitride. As shown in FIG. 11B, the nitride layer 1106 is conformal with the top of semiconductor device 1100.

At step 1004, a sacrificial layer 1108 may be formed over the nitride layer 1106. The sacrificial layer 1108 may comprise any suitable material. For instance, according to some various embodiments, the sacrificial layer 1108 may comprise an oxide, BARC, photoresist, etc. The device 1100 is depicted after step 1004 in FIG. 11C.

Figure 11D:
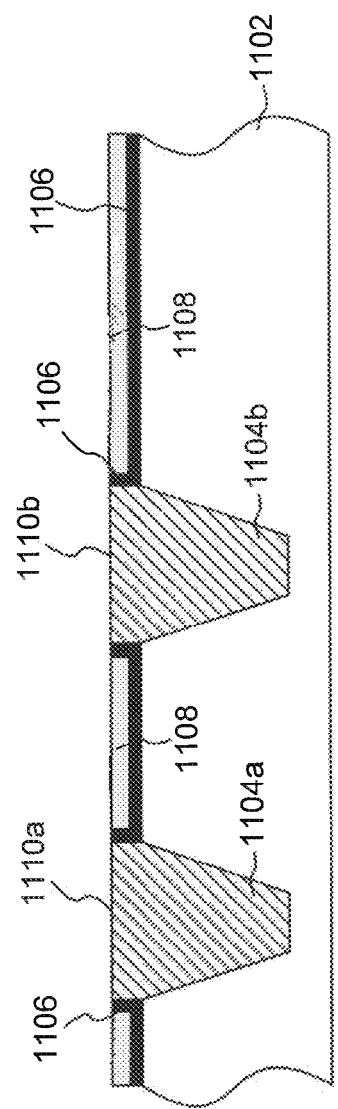
Figure 11E:
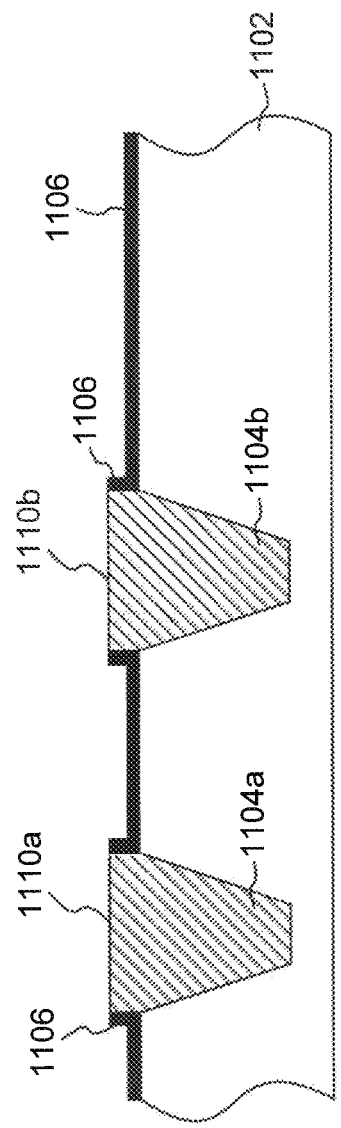

At step 1006, portions of the sacrificial layer 1108, the nitride layer 1106, and the STI regions 1104 can be removed. As shown in FIG. 11D, the removed portions of the sacrificial layer 1108, the nitride layer 1106, and the STI regions 1104 cause a discontinuity in the nitride layer 1106. According, to various embodiments, the removed portions 1108, 1106, and 1104 can be removed by dry or wet etch, polish back, or any other appropriate means. At step 1008, the remaining portion of the sacrificial layer 1108 can be removed from the device 1100, as depicted in FIG. 11E.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device, comprising:
    a memory gate, disposed in a first region of the semiconductor device, wherein the memory gate includes a first gate conductor layer disposed such that it overlaps a charge trapping dielectric;
    a first select gate disposed in the first region adjacent to a sidewall of the memory gate;
    a second select gate disposed adjacent to the first select gate in the first region such that the first select gate is disposed between the memory gate and the second select gate;
    a sidewall dielectric disposed between the sidewall of the memory gate and the first select gate; and
    a dielectric layer disposed beneath the first select gate and the second select gate, wherein the dielectric layer is disposed such that it is separated from the charge trapping layer and the memory gate by the sidewall dielectric.

2. The device of claim 1, wherein the first select gate comprises a second gate conductor layer.

3. The device of 1, further comprising a second logic gate disposed in a third region of the semiconductor device.

4. The device of 3, wherein the second logic gate comprises the first gate conductor layer.

5. The device of claim 1, wherein the charge trapping dielectric is electrically isolated from one or more other charge trapping dielectrics.

6. The device of claim 1, wherein the charge trapping dielectric comprises a nitride layer and an dielectric layer.

7. The device of claim 6, wherein the nitride layer comprises a silicon rich nitride.

8. The device of 1, further comprising:
a memory dielectric disposed in the first region;
a gate dielectric disposed in the second region; and
a second gate dielectric disposed the third region,
wherein two of the memory gate dielectric, the gate dielectric, and the second gate dielectric have different thicknesses.

9. The device of 1, wherein the dielectric comprises a nitride layer that is discontinuous from the charge trapping dielectric.

10. The device of 9, wherein the nitride layer comprises a separate layer from the charge trapping dielectric.

11. The semiconductor device of claim 1, wherein the first and second select gates comprise a second conductor layer.

12. The semiconductor device of claim 1, further comprising a second memory gate disposed adjacent to the second select gate.

13. The semiconductor device of claim 12, wherein the second select gate is disposed on a sidewall of the second memory gate.

14. The semiconductor device of claim 12, wherein the second memory gate comprises the first gate conductor layer.

15. A semiconducting device, comprising:
a first memory cell comprising a first memory gate and a first select gate disposed on a sidewall of the first memory gate, wherein the first memory gate is disposed such that it overlaps a first charge trapping dielectric, and wherein a sidewall dielectric is disposed between the first memory gate and the first select gate;
a second memory cell comprising a second memory gate and a second select gate, wherein the second select gate is disposed on a sidewall of the second memory gate and adjacent to the first select gate, wherein the second memory gate is disposed such that it overlaps a second charge trapping dielectric, and wherein the first and second select gates are disposed between the first and second memory gates; and
a dielectric layer disposed between the first and second memory gates and beneath the first and second select gates such that the dielectric layer is shared by the first and second select gates, wherein the dielectric layer is separated from the charge trap in layer and the first memory gate by the sidewall dielectric.

16. The semiconducting device of claim 15, wherein the first memory gate and the second memory gate comprise a first gate conductor layer.

17. The semiconducting device of claim 15. wherein the first select gate and the second select gate comprise a second gate conductor layer.

18. The semiconducting device of claim 15, wherein the first and second memory cells are disposed in a memory region.

19. The semiconducting device of claim 18, further comprising a logic region that includes a logic gate.

20. The semiconducting device of claim 19, wherein the logic region comprises a logic dielectric.

21. The semiconducting device of claim 20, wherein the logic dielectric has a different thickness than the dielectric layer.

22. The semiconducting device of claim 15, further comprising a first sidewall dielectric disposed between the first memory gate and the first select gate and a second sidewall dielectric disposed between the second memory gate and the second select gate.

23. The semiconducting device of claim 15, wherein the first and second charge trapping dielectrics are non-overlapping with the dielectric layer.

24. The semiconducting device of claim 1, wherein the dielectric layer is disposed such that it is non-overlapping with the charge trapping dielectric.

* * * * *